US009318848B2

(12) United States Patent
Hashim

(10) Patent No.: US 9,318,848 B2
(45) Date of Patent: Apr. 19, 2016

(54) COMMUNICATIONS CONNECTORS INCLUDING LOW IMPEDANCE TRANSMISSION LINE SEGMENTS THAT IMPROVE RETURN LOSS AND RELATED METHODS

(71) Applicant: CommScope, Inc. of North Carolina, Hickory, NC (US)

(72) Inventor: Amid I. Hashim, Plano, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 14/449,383

(22) Filed: Aug. 1, 2014

(65) Prior Publication Data

US 2016/0036166 A1 Feb. 4, 2016

(51) Int. Cl.
 *H01R 24/00* (2011.01)
 *H01R 13/6466* (2011.01)
 *H01R 24/64* (2011.01)

(52) U.S. Cl.
 CPC ............ *H01R 13/6466* (2013.01); *H01R 24/64* (2013.01)

(58) Field of Classification Search
 CPC .......................... H01R 23/025; H01R 23/005
 USPC .................... 439/676, 941; 333/260
 See application file for complete search history.

(56) References Cited

U.S. PATENT DOCUMENTS

| | | | |
|---|---|---|---|
| 6,379,157 B1 | 4/2002 | Curry et al. | |
| 7,264,516 B2 | 9/2007 | Hashim et al. | |
| 7,326,089 B2 | 2/2008 | Hashim | |
| 7,402,085 B2 | 7/2008 | Hammond, Jr. et al. | |
| 7,787,615 B2 | 8/2010 | Hammond, Jr. et al. | |
| 8,047,879 B2 * | 11/2011 | Hashim | H01R 13/6658 439/676 |
| 8,403,709 B2 | 3/2013 | Hammond, Jr. et al. | |
| 8,915,756 B2 * | 12/2014 | Schumacher | H01R 13/6466 439/676 |
| 2006/0014410 A1 | 1/2006 | Caveney et al. | |
| 2008/0009199 A1 | 1/2008 | Hashim | |
| 2013/0210289 A1 | 8/2013 | Schumacher et al. | |
| 2014/0203886 A1 | 7/2014 | Schumacher | |
| 2014/0206240 A1 | 7/2014 | Schumacher et al. | |

FOREIGN PATENT DOCUMENTS

JP 2008-507092 A 3/2008

OTHER PUBLICATIONS

International Search Report and Written Opinion Corresponding to International Application No. PCT/US2015/042638; Date of Mailing: Nov. 6, 2015; 7 Pages.

* cited by examiner

*Primary Examiner* — Vanessa Girardi
(74) *Attorney, Agent, or Firm* — Myers Bigel & Sibley, P.A.

(57) ABSTRACT

A communications connector includes a printed circuit board having a first internal conductive layer and first and second external conductive layers that are stacked with dielectric layers therebetween. The printed circuit board has input terminals, output terminals and signal current carrying conductive paths which electrically connect respective ones of the input and output terminals. The signal current carrying conductive paths are arranged in pairs to form differential transmission lines. The first signal current carrying conductive path includes a first segment that is on the first internal conductive layer which is routed in a vertically stacked arrangement with a second segment of the second signal current carrying conductive path, the first and second signal current carrying conductive paths being part of the same differential transmission line.

21 Claims, 12 Drawing Sheets

COMMUNICATIONS CONNECTORS INCLUDING LOW IMPEDANCE TRANSMISSION LINE SEGMENTS THAT IMPROVE RETURN LOSS AND RELATED METHODS

FIELD OF THE INVENTION

The present invention relates generally to communications connectors and, more particularly, to communications connectors such as modular jacks and plugs that may exhibit improved return loss performance.

BACKGROUND

Many hardwired communications systems use plug and jack connectors to connect a communications cable to another communications cable or to a piece of equipment such as a computer, printer, server, switch or patch panel. By way of example, high speed communications systems routinely use such plug and jack connectors to connect computers, printers and other devices to local area networks and/or to external networks such as the Internet. FIG. 1 depicts a highly simplified example of such a hardwired high speed communications system that illustrates how plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at each end thereof. Typically, the cable 12 includes eight insulated conductors. As shown in FIG. 1, plug 14 is inserted into an opening or "plug aperture" 16 in the front side of the communications jack 15 so that the contacts 21 or "plug blades" of communications plug 14 mate with respective contacts of the communications jack 15. If the cable 12 includes eight conductors, the communications plug 14 and the communications jack 15 will typically each have eight contacts. The communications jack 15 includes a wire connection assembly 17 at the back end thereof that receives a plurality of conductors (e.g., eight) from a second cable 18 that are individually pressed into slots in the wire connection assembly 17 to establish mechanical and electrical connections between each conductor of the second cable 18 and a respective one of a plurality of conductive paths through the communications jack 15. The other end of the second cable 18 is connected to a network server 20 which may be located, for example, in a telecommunications closet of a commercial office building. Communications plug 13 similarly is inserted into the plug aperture of a second communications jack (not pictured in FIG. 1) that is provided in the back of the computer 11. Thus, the patch cord 12, the cable 18 and the communications jack 15 provide a plurality of electrical paths between the computer 11 and the network server 20. These electrical paths may be used to communicate electrical information signals between the computer 11 and the network server 20.

Industry standards such as, for example, the ANSI/TIA-568-C.2 standard approved Aug. 11, 2009 by the Telecommunications Industry Association (also known as the "Balanced Twisted-Pair Telecommunications Cabling and Components Standards"), have been developed that help ensure that plug and jack connectors manufactured by different vendors will work together and meet minimum performance criteria. Many of these standards specify that the plug and jack connectors conform to the "RJ-45" interface specification. Pursuant to this specification, each plug and jack connector includes eight conductive paths, which are arranged as four differential pairs of conductive paths, and eight interface contacts (which are typically referred to as the "blades" of the plug and the "jackwire contacts" of the jack). Thus, each plug, jack and cable segment in FIG. 1 includes four differential pairs, and thus a total of four differential transmission lines are provided between the computer 11 and the server 20 that may be used to carry two way communications therebetween (e.g., two of the differential pairs may be used to carry signals from the computer 11 to the server 20, while the other two may be used to carry signals from the server 20 to the computer 11). In the connection region where the blades of the plug mate with the jackwire contacts (the "plug-jack mating region"), the eight plug blades 21 (see FIG. 1) and the eight jackwire contacts 1-8 (see FIG. 2) are aligned in a row. FIG. 2 also shows the assignment of the jackwire contacts 1-8 to the four differential pairs. Communications systems that use RJ-45 plugs, jacks and cables are often referred to as "Ethernet" communications systems.

When signals are transmitted over a conductor (e.g., an insulated copper wire) in a communications cable, electrical noise from external sources may be picked up by the conductor, degrading the quality of the signal. In order to counteract such noise sources, the information signals in the above-described communications systems are typically transmitted between devices over communications cables that include one or more pairs of conductors (hereinafter a "differential pair" or simply a "pair") rather than over a single conductor. The two conductors of each differential pair are twisted tightly together in the communications cables and patch cords so that the eight conductors are arranged as four twisted differential pairs of conductors. The signals transmitted on each conductor of a differential pair may, for example, have equal magnitudes, but opposite phases, and the information signal is embedded as the voltage difference between the signals carried on the two conductors of the pair. When the signal is transmitted over a twisted differential pair of conductors, each conductor in the differential pair often picks up approximately the same amount of noise from these external sources. Because approximately an equal amount of noise is added to the signals carried by both conductors of the twisted differential pair, the information signal is typically not disturbed, as the information signal is extracted by taking the difference of the signals carried on the two conductors of the differential pair, and this subtraction process may mostly cancel out the noise signal.

Referring again to FIG. 2, it can be seen that the arrangement of the eight jackwire contacts 1-8 in the plug mating region will result in unequal capacitive and/or inductive coupling between the four differential pairs. These unequal couplings between the conductors of different differential pairs give rise to another type of noise that is known as "crosstalk."

In particular, "crosstalk" refers to unwanted signal energy that is capacitively and/or inductively coupled onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal that is transmitted over the victim differential pair.

In order to reduce the effects of crosstalk, communications jacks now routinely include compensating crosstalk circuits that introduce compensating crosstalk that is used to cancel much of the "offending" crosstalk that is introduced in the plug and in the plug-jack mating region as a result of the industry-standardized connector configurations and interoperability standards. These crosstalk compensation circuits are typically implemented by routing conductors of two different differential pairs in a jack close to each other to intentionally create capacitive and/or inductive coupling that cancels capacitive and inductive couplings that arise between the conductors of the two differential pairs in other portions of the mated plug-jack connection.

Another important parameter for the above-described plug and jack connectors is the return loss that is experienced along each differential transmission line through the connector. The return loss of a transmission line is a measure of how well the transmission line is impedance matched to the system reference impedance (typically 100 ohms for balanced twisted-pair cabling systems). Deviations from this reference impedance by the transmission line or a terminating device or other loads that are inserted along it may result in impedance discontinuities that will cause undesirable signal reflections. In particular, the return loss is a measure of the signal power that is lost due to such signal reflections that may occur at discontinuities (impedance mismatches) in the transmission line. Return loss is typically expressed as a ratio in decibels (dB) as follows:

$$RL(dB) = 10\log_{10}\frac{P_i}{P_r}$$

where RL(dB) is the return loss in dB, $P_i$ is the incident power and $P_r$ is the reflected power. High return loss values indicate a good impedance match (i.e., little signal loss due to reflection), which results in lower insertion loss values, which is desirable.

In Ethernet communications systems, each transmission line in the cables and connectors, and the terminating devices, will typically be designed to have a differential impedance of 100 ohms, if possible, in order to obtain high return loss values. The industry standards typically specify minimum return loss requirements for the transmission lines within individual connectors, within mated connectors (i.e., across a mated plug and jack) and/or for an entire communications channel (i.e., for one or more differential transmission lines that extend from computer 11 to server 20 in FIG. 1 across various connectors and cable segments). As return loss typically decreases with increasing frequency (i.e., the return loss performance gets worse with increasing frequency), the industry standards typically specify minimum return loss values that must be met as a function of frequency for the specified components and/or channels.

SUMMARY

Pursuant to embodiments of the present invention, communications connectors are provided that include a printed circuit board having a first internal conductive layer, a first external conductive layer and a second external conductive layer. The first and second external conductive layers and the first internal conductive layer are stacked along a vertical axis with dielectric layers therebetween. The printed circuit board further includes a plurality of input terminals, a plurality of output terminals and a plurality of signal current carrying conductive paths, where each signal current carrying conductive path electrically connects a respective one of the input terminals to a respective one of the output terminals. The signal current carrying conductive paths are arranged in pairs to form a plurality of differential transmission lines. In these connectors, a first signal current carrying conductive path includes a first segment that is on the first internal conductive layer of the printed circuit board which is routed in a vertically stacked arrangement with a second segment of a second signal current carrying conductive path, the first and second signal current carrying conductive paths being part of the same differential transmission line.

In some embodiments, the communications connector may be an RJ-45 jack that includes first through eighth jackwire contacts that are electrically connected to respective ones of the plurality of input terminals and first through eighth wire connection terminals that are electrically connected to respective ones of the plurality of output terminals. In such embodiments, the plurality of signal current carrying conductive paths comprise first through eighth signal current carrying conductive paths, and the plurality of differential transmission lines comprises first through fourth differential transmission lines.

In some embodiments, at least one of the signal current carrying conductive paths of the differential transmission line that includes the first and second signal current carrying conductive paths may further include an inductive self-coupling section.

In some embodiments, the first signal current carrying conductive path may include a first inductive self-coupling section and the second signal current carrying conductive path may include a second inductive self-coupling section.

In some embodiments, the first segment of the first signal current carrying conductive path may have a first average width that exceeds the average width of the entirety of the first signal current carrying conductive path and/or the second segment of the second signal current carrying conductive path may have a second average width that exceeds the average width of the entirety of the second signal current carrying conductive path.

In some embodiments, the location and/or magnitude of at least one of the vertically stacked first and second segments or the inductive self-coupling section may be selected to provide a local maximum in the return loss spectrum of the differential transmission line that includes the first and second signal current carrying conductive paths, where the maximum in the return loss spectrum is between a first frequency that is half a maximum specified operating frequency for the RJ-45 jack and 1.5 times the maximum specified operating frequency for the RJ-45 jack.

In some embodiments, the communications connector may be an RJ-45 plug, the plurality of input terminals may comprise first through eighth input terminals that are electrically connected to respective first through eighth plug blades, the plurality of output terminals may comprise first through eighth output terminals that are electrically connected to respective first through eighth conductors of a communications cable, the plurality of signal current carrying conductive paths may comprise first through eighth signal current carrying conductive paths, and the plurality of differential transmission lines may comprise first through fourth differential transmission lines.

Pursuant to further embodiments of the present invention, communications connectors are provided that include a printed circuit board that includes a plurality of input terminals, a plurality of output terminals, and a plurality of signal current carrying conductive paths, each of which electrically connects a respective one of the input terminals to a respective one of the output terminals. The signal current carrying conductive paths are arranged in pairs to form a plurality of differential transmission lines, the plurality of differential transmission lines including a first differential transmission line. The first and second signal current carrying conductive paths form the first differential transmission line. The first differential transmission line includes a first section in which a first segment of the first signal current carrying path is routed on a first layer of the printed circuit board and is positioned to capacitively and inductively couple with a second segment of the second signal current carrying path that is routed on a second layer of the printed circuit board that is different than the first layer. The first section of the first differential transmission line has a characteristic impedance that is at least twenty percent below a pre-selected impedance. The first differential transmission line includes a second section that has a second characteristic impedance that is at least twenty percent greater than the pre-selected impedance. In some embodiments, the pre-selected impedance may be 100 ohms.

In some embodiments, the first section may be between the second section of the first differential transmission line and the output terminals that are electrically connected to the first differential transmission line.

In some embodiments, the communications connector may be an RJ-45 jack, the plurality of input terminals may comprise first through eighth input terminals, the plurality of output terminals may comprise first through eighth output terminals, the plurality of signal current carrying conductive paths may comprise first through eighth signal current carrying conductive paths, and the plurality of differential transmission lines may comprise the first differential transmission line and second through fourth differential transmission lines.

In some embodiments, at least one of the first and second signal current carrying conductive paths may include an inductive self-coupling section between the first and second sections.

In some embodiments, the first section may comprise a first segment of the first signal current carrying conductive path that is routed in a vertically stacked arrangement with a second segment of the second signal current carrying conductive path, and at least one of the first segment and the second segment may be on an internal layer of the printed circuit board.

In some embodiments, the locations and/or characteristic impedances of the first and second sections of the first differential transmission line may be selected to provide a local maximum in the return loss spectrum for the first differential transmission line that is between a first frequency that is half a maximum specified operating frequency for the communications connector and 1.5 times the maximum specified operating frequency for the communications connector.

In some embodiments, the second section may be directly connected to the first section by a third section having an impedance within twenty percent of the pre-selected impedance.

Pursuant to still further embodiments of the present invention, communications connectors are provided that include a printed circuit board having a first internal conductive layer, first and second external conductive layers, and first and second dielectric layers, the first dielectric layer between the first external conductive layer and the first internal conductive layer and the second dielectric layer between the first internal conductive layer and the second external conductive layer, the first and second external conductive layers, the first internal conductive layer and the first and second dielectric layers stacked along a vertical axis. The printed circuit board includes first through eighth input terminals, first through eighth output terminals, and first through eighth signal current carrying conductive paths, each of which electrically connecting a respective one of the input terminals to a respective one of the output terminals, the first through eighth signal current carrying conductive paths arranged in pairs to form first through fourth differential transmission lines, with the first and second signal current carrying conductive paths forming the first differential transmission line. A return loss compensation circuit is formed in the first differential transmission line that includes a high impedance section in series with a low-impedance section, where the impedances of the high and low impedance sections and the distance between the high and low impedance sections are selected to improve the return loss performance of the first differential transmission line at a maximum operating frequency of the communications connector. The low impedance section comprises a first segment of the first signal carrying conductive path that is on a first layer of the printed circuit board that runs in generally the same direction as a second segment of the second signal current carrying conductive path that is on a second internal layer of the printed circuit board that is different than the first layer, the first and second segments positioned to have a capacitive reactance therebetween that exceeds their inductive reactance.

In some embodiments, the impedances of the high and low impedance sub-sections and the distance between the high and low impedance sections may be selected to create a peak in the return loss spectrum for the first differential transmission line that defines a local maximum in the return loss spectrum for the first differential transmission line, and the maximum operating frequency of the communications connector may be within the peak in the return loss spectrum.

In some embodiments, the first and second segments may be routed in a vertically stacked arrangement.

In some embodiments, the low impedance section may be between the high impedance section and the output terminals that are electrically connected to the first differential transmission line.

In some embodiments, the high impedance section may be formed by including a spiral in at least one of the first and second signal current carrying conductive paths to form an inductive self-coupling section in at least one of the first and second signal current carrying conductive paths.

In some embodiments, the first segment of the first signal carrying conductive path may have a first average width that exceeds the average width of the entirety of the first signal current carrying conductive path and/or the second segment of the second signal carrying conductive path may have a second average width that exceeds the average width of the entirety of the second signal current carrying conductive path.

DETAILED DESCRIPTION

Figure 1:
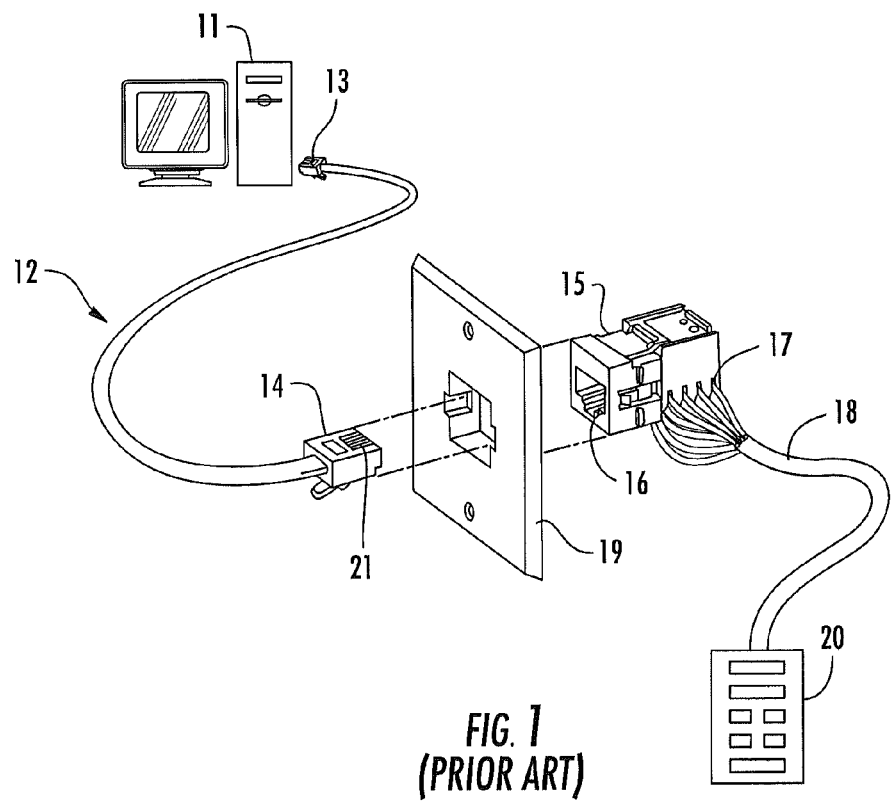
FIG. 1 is a simplified schematic diagram illustrating the use of conventional communications plugs and jacks to interconnect a computer with network equipment.
Figure 2:
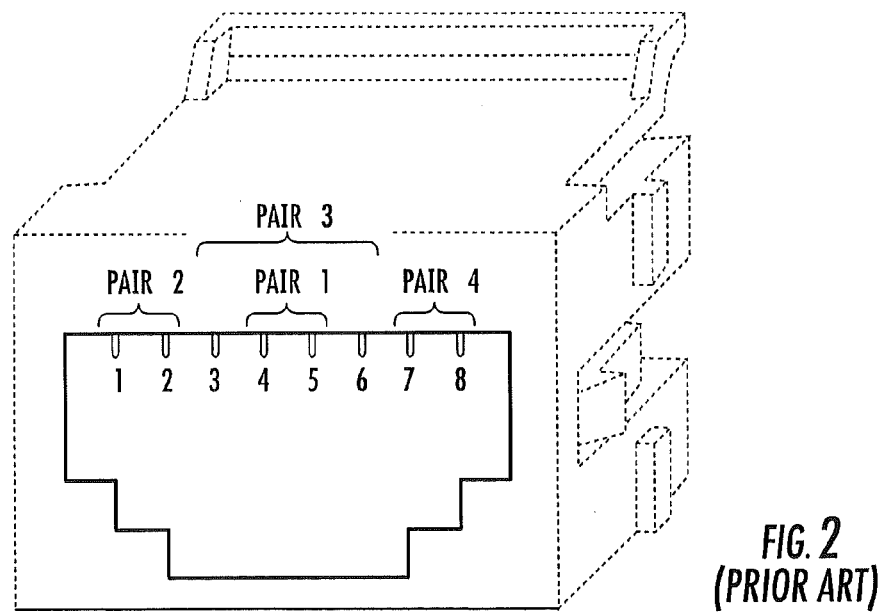
FIG. 2 is a schematic diagram illustrating the TIA 568B modular jack contact wiring assignments for a conventional 8-position communications jack as viewed from the front opening of the jack.

Pursuant to embodiments of the present invention, communications connectors such as communications jacks and plugs are provided that may exhibit improved return loss performance.

As discussed above, the connectors in Ethernet communications systems typically inject "offending" and/or "compensating" crosstalk between the differential transmission lines thereof. Unfortunately, this crosstalk appears as loads along the differential transmission lines of the connectors that can degrade the return loss performance of the connectors.

The characteristic impedance of a differential transmission line varies based on, among other things, the capacitance between the pair of conductors of the differential transmission line and the inductance of the pair of conductors of the differential transmission line. The inductance of the pair of conductors of the differential transmission line is equal to the sum of the self-inductances of the two conductors of the pair minus the mutual inductance between them. For a lossless differential transmission line the characteristic impedance, Zc, can be expressed by the following equation in terms of the per unit length capacitance between its pair of conductors, C, and the per unit length inductance of its pair of conductors, L.

$$Zc = \sqrt{\frac{L}{C}}$$

Pursuant to embodiments of the present invention, communications connectors are provided that have printed circuit boards that include differential transmission lines that have sections where the characteristic impedance of the differential transmission line is designed to be below a pre-selected value such as, for example, 100 ohms. This low impedance section may be provided to offset the negative effects of a high impedance section that occurs elsewhere along the differential transmission line. The low impedance section may be implemented by transitioning at least one of the conductive paths of the differential transmission line to an interior conductive layer of the printed circuit board and then routing the other conductive path of the differential transmission line on a different conductive layer, that may be internal or external, so that the two conductive paths overlap (or almost overlap) when the printed circuit board is viewed from above. Parameters such as the length of the overlapping section, the degree of overlap, the widths of the overlapping conductive segments, the vertical separation between the overlapping conductive segments and the dielectric constant of the printed circuit board material may be selected to lower the impedance of the differential transmission line. The resulting characteristic impedance value, as well as the length of the low impedance section and its location along the differential transmission line may be selected to improve the return loss of the differential transmission line.

In some embodiments, a high impedance section may be included along the differential transmission line immediately adjacent to the low impedance section. The high impedance section may be implemented, for example, by including inductive self-coupling segments on one or both of the conductive paths that form the differential transmission line. In some embodiments, the location and magnitudes of the low and high impedance sections may be adjusted to create a resonance that forms a peak having a local maximum in the return loss spectrum for the differential transmission line. The shape and location of the peak in the return loss spectrum may be selected to improve the return loss of the differential transmission line. For example, the connector design may be tuned so that a maximum operating frequency for the differential transmission line falls within the peak in the return loss spectrum.

Embodiments of the present invention will now be discussed in greater detail with reference to FIGS. 3-9, which depict example embodiments of the invention.

Figure 3:
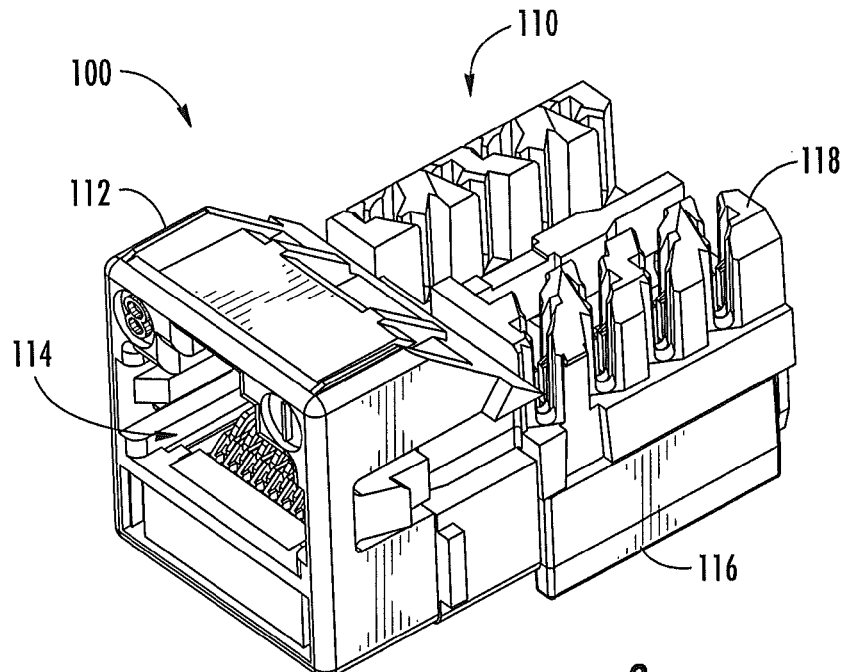
FIG. 3 is a perspective view of a communications jack according to embodiments of the present invention.
Figure 4A:
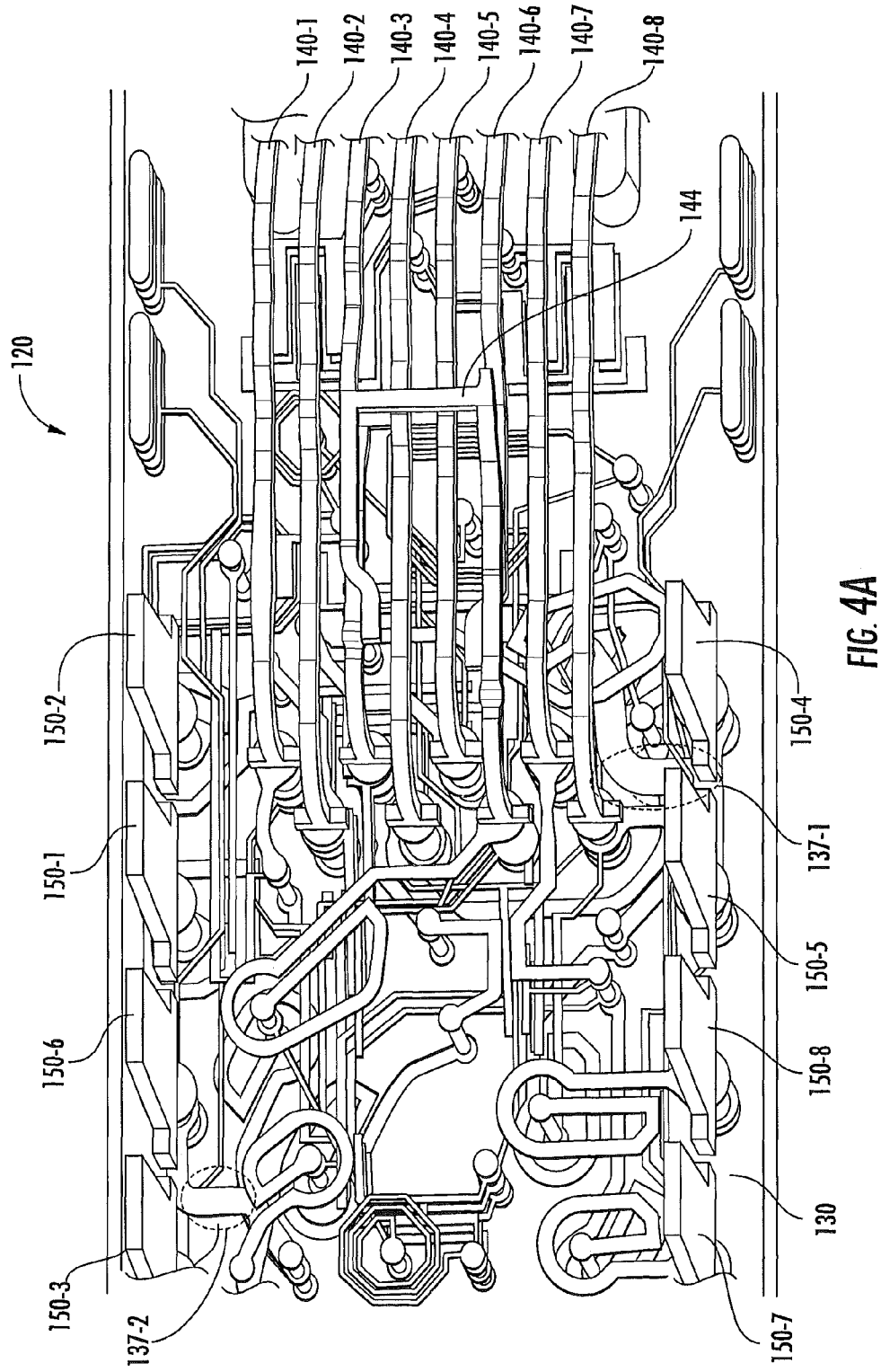
FIGS. 4A and 4B are perspective views of a communications insert of the jack of FIG. 3.
Figure 4B:
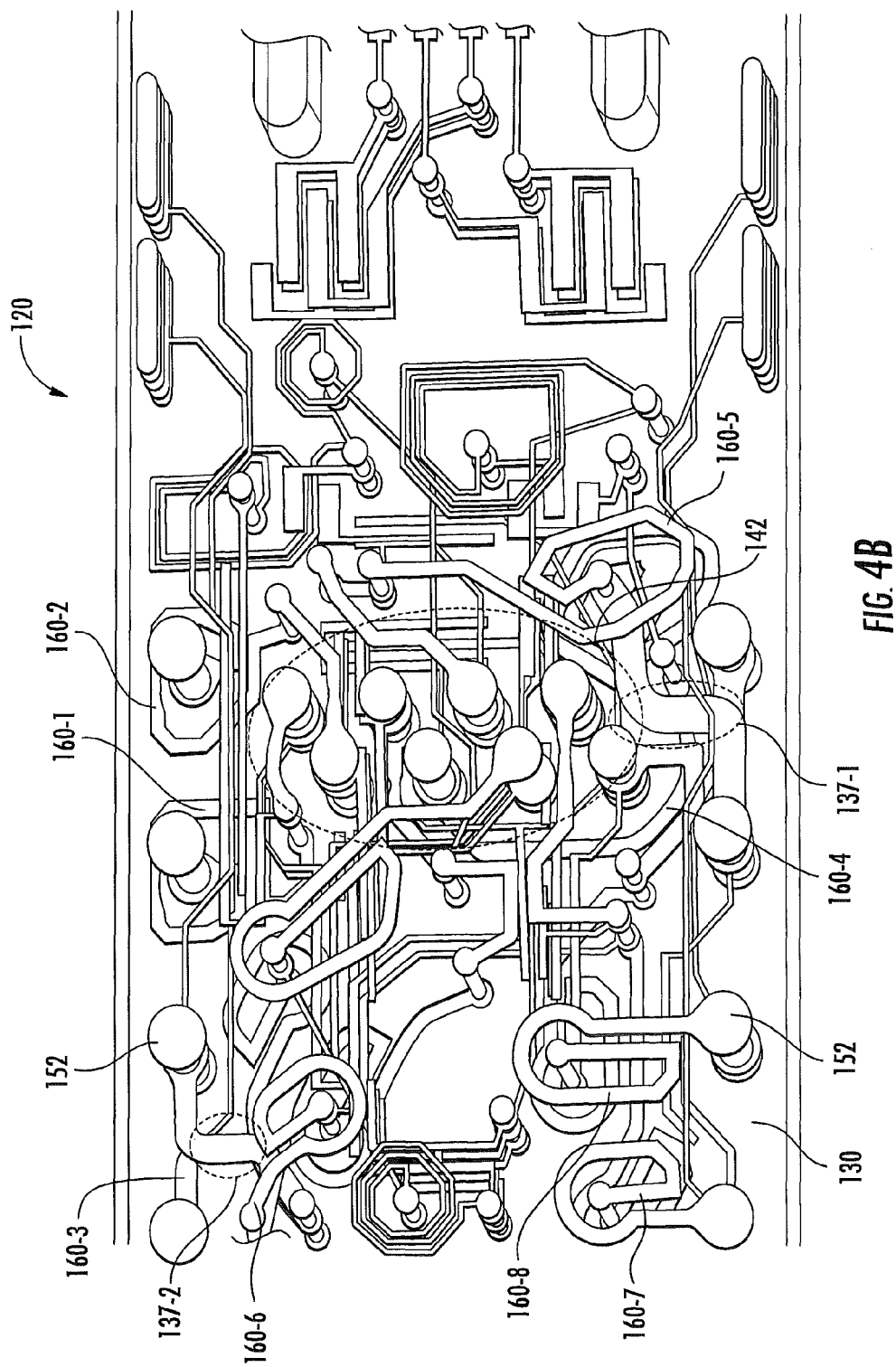

FIGS. 3-5 illustrate a communications jack 100 according to certain embodiments of the present invention. In particular, FIG. 3 is a perspective view of the communications jack 100, FIGS. 4A and 4B are perspective views of a communications insert 120 that is included in the jack 100, and FIGS. 5A-5H are side and plan views of the conductive layers of a printed circuit board 130 that is part of the communications insert 120.

As shown in FIG. 3, the jack 100 includes a multi-piece housing 110, which in the depicted embodiment includes a jack frame 112, a cover 116 and a terminal housing 118. A communications insert 120 (see FIGS. 4A-4B) is received within the housing 110. The jack frame 112 includes a plug aperture 114 that is sized to receive a mating plug. The terminal housing 118 covers and protects a plurality of wire connection terminals 150 (see FIG. 4A) that serve as the output terminals of the jack 100. The cover 116 covers and protects a lower surface of the communications insert 120. The housing pieces 112, 116, 118 may be made of a suitable insulative plastic material that meets all applicable standards with respect to, for example, dielectric breakdown and flammability such as, for example, polycarbonate, ABS, and blends thereof. While jack 100 includes a specific multi-piece housing, it will be appreciated that the housing 110 may be any conventional or unconventional housing structure, and may comprise a one-piece housing in some embodiments.

FIGS. 4A and 4B are top perspective views of the communications insert 120. As shown in FIG. 4A, the communications insert 120 includes a printed circuit board 130, eight jackwire contacts 140-1 through 140-8, and eight wire connection terminals 150-1 through 150-8. Herein, when a connector includes multiple of the same elements the elements may be referred to individually by their full reference number (e.g., jackwire contact 140-3) and may be referred to collectively by the first part of their reference numeral (e.g., the jackwire contacts 140). The communications insert 120 may also include one or more guide structures (not shown) that support the jackwire contacts 140 and/or that maintain the jackwire contacts 140 in their proper positions for engaging the blades of a mating plug that is received in plug aperture 114 of jack 100. FIG. 4B is identical to FIG. 4A except that the jackwire contacts 140 and wire connection terminals 150 are omitted to more clearly illustrate the printed circuit board 130.

The printed circuit board 130 may comprise a substrate that includes a plurality of stacked dielectric layers and conductive layers. Hereinafter when the word "layer" is used by itself it is intended to refer to a conductive layer rather than a dielectric layer. In some embodiments, the printed circuit board may comprise a conventional rigid printed circuit board that includes at least two dielectric layers and at least three conductive layers. Each conductive layer may comprise conductive structures that are printed or otherwise deposited or formed on a top surface or a bottom surface of one of the dielectric layers. The dielectric layers may comprise, for example, FR4 layers, although any suitable material may be used for any or all of the dielectric layers. The top and bottom surfaces of the printed circuit board 130 may be coated with a protective insulative coating. In other embodiments, the printed circuit board 130 may comprise a multi-layer flexible printed circuit board or a hybrid printed circuit board that includes both rigid and flexible sections. Typically, the printed circuit board 130 is a planar structure that is much longer and much wider than it is thick. The printed circuit board 130 may include metal-filled or plated-through vias or other structures that electrically connect elements on a first conductive layer of the printed circuit board 130 to elements on one or more other conductive layers of the printed circuit board 130. The printed circuit board 130 is discussed in more detail below with reference to FIGS. 5A-5H.

As shown in FIGS. 3 and 4A, each of the jackwire contacts 140 comprises an elongated wire that is formed from a resilient metal such as spring-tempered phosphor bronze, beryllium copper, or the like. A typical cross-section of each jackwire contact 140 is 0.017 inch wide by 0.010 inch thick, although other sized and/or shaped (e.g., round) contacts may be used. The printed circuit board 130 includes eight metal-plated vias 142, which are best seen in FIG. 4B. Each jackwire contact 140 is mounted in cantilevered fashion with the base of the jackwire contact 140 received in a respective one of the metal-plated vias 142 and the distal end of each jackwire contact 140 extending above the printed circuit board 130 towards the front of the printed circuit board 130.

As shown in FIG. 4A, jackwire contacts 140-3 and 140-6 include a crossover 144 in that jackwire contact 140-3 crosses over jackwire contact 140-6 when the jackwire contacts 140 are viewed from above, i.e., when the jack 100 is oriented as shown in FIG. 4A. To effect this crossover 144, jackwire contact 140-3 crosses over jackwire contacts 140-4 and 140-5 and jackwire contact 140-6 passes under jackwire contacts 140-4 and 140-5. While one possible jackwire contact configuration is illustrated in FIG. 4A, essentially any jackwire contact configuration will work with embodiments of the present invention. Accordingly, the jackwire contacts 140 may have the same or different profiles, may or may not be generally aligned in a side-by-side relationship, may or may not include crossovers, may have different numbers of crossovers, may have staggers where they enter the wiring board, may be cantilevered from the front, may be implemented as conductive traces on a flexible printed circuit board, etc. in other embodiments of the present invention. Thus, it will be appreciated that the term "jackwire contact" is used broadly herein, and includes, for example, any contact that is appropriate for mating with a blade of an RJ-45 plug.

The wire connection terminals 150 are implemented as insulation displacement contacts or "IDCs" in the jack of FIGS. 3-5. Each IDC 150 is mounted along one of the two side edges of the printed circuit board 130 in respective ones of a plurality of metal-plated apertures 152 through the printed circuit board 130. It will be appreciated that any appropriate wire connection terminals 150 may be used, and that the wire connection terminals 150 may be mounted in different locations on the printed circuit board 130.

The printed circuit board 130 further includes a plurality of signal current carrying conductive paths 160-1 through 160-8. Each of the signal current carrying conductive paths 160 electrically connects a respective one of the jackwire contacts 140-1 through 140-8 to a respective one of the IDCs 150-1 through 150-8. Each signal current carrying conductive path 160 may include one or more conductive segments that may be provided on different layers of the printed circuit board 130, and may include conductive layer connection structures such as conductive vias that electrically connect conductive segments that are on different layers of the printed circuit board 130.

Herein, the term "signal current carrying conductive path" is used to refer to a conductive path on which an electrical signal will travel on its way from an input terminal to an output terminal of a printed circuit board of a communications connector. Signal current carrying conductive paths may be formed by cascading one or more conductive traces on a printed circuit board and metal-filled apertures or other layer transferring structures that physically and electrically connect conductive traces on different layers of the printed circuit board. Branches that extend from a signal current carrying conductive path and then dead end such as, for example, a branch from the signal current carrying conductive path that forms one of the electrodes of an inter-digitated finger capacitor, are not considered part of the signal current carrying conductive path, even though these branches are electrically connected to the signal current carrying conductive path. While a small amount of current will flow into such dead end branches, the current that flows into these dead end branches generally does not flow to the output terminal of the printed circuit board that corresponds to the input terminal of the printed circuit board that receives the input electrical signal (note that the input terminals and output terminals of the printed circuit board 130 may be the metal-plated apertures 142, 152 that hold the jackwire contacts 140 and IDCs 150, respectively, in the embodiment of FIGS. 3-5). Herein, the current that flows into such dead end branches is referred to as a "coupling current," whereas the current that flows along a signal current carrying conductive path from an input terminal to an output terminal of the printed circuit board is referred to as a "signal current." Typically capacitors that are used to provide crosstalk compensation are implemented as coupling elements that are not part of the signal current carrying conductive paths.

The printed circuit board 130 also includes electrical circuit elements arranged on or within the board to compensate for crosstalk that may otherwise be present in the jack 100 and/or in an associated plug that mates with the jack 100. Such circuit elements include, but are not limited to, plate capacitors implemented on two or more layers or surfaces of the board and interdigitated finger capacitors.

In order to comply with various industry standards such as, for example, the above-referenced ANSI/TIA-568-C.2 standard, RJ-45 plugs are intentionally designed to include specified levels of crosstalk between the four differential transmission lines included therein. Because the plug blades for Pair 1 are surrounded by the plug blades for Pair 3, the industry standards require that a particularly high level of "offending" crosstalk be present in the plug between Pairs 1 and 3. In order to cancel this offending crosstalk, crosstalk cancellation structures are included in the jack that inject at least a corresponding amount of "compensating" crosstalk that is designed to cancel the offending crosstalk. Moreover, if multi-stage crosstalk compensation is used, it is not uncommon for the jack to include structures that inject amounts of "compensating" crosstalk that exceed the amount of offending crosstalk. Both the offending crosstalk and the compensating crosstalk appear as loads on the transmission lines for Pairs 1 and 3 which will tend to cause the impedance of these transmission lines to deviate from a desired value such as 100 ohms.

The impedance of a differential transmission line varies based on, among other things, the amount of capacitance between the two conductors of the differential transmission line and the amount of inductance of the two conductors of the differential transmission line. Generally speaking, increasing the amount of capacitance while holding all other parameters equal tends to lower impedance of the differential transmission line, while increasing the amount of inductance while holding all other parameters equal tends to increase impedance of the differential transmission line. In a typical mated RJ-45 plug/RJ-45 jack connection, the transmission line for Pair 1 typically has both low impedance and high impedance sections. For example, the large amount of capacitance between the two plug blades of Pair 1, due to the large area of overlap and high permittivity between them, tends to result in a low impedance segment within the plug. However, the jackwire contacts for Pair 1 typically (see FIG. 4A) have elongated shapes along their respective signal current flow paths. This causes a high level of inductance, resulting in a high impedance section in Pair 1. Both inductive and capacitive crosstalk compensation circuits are typically provided which results in additional high and low impedance sections along Pair 1. This combination of low impedance and high impedance section, in many cases, may result in an input impedance of about 100 ohms when the jack connection is terminated with a 100 ohm load (or at least one close enough to 100 ohms that the impedance may be set to near 100 ohms using conventional techniques for adjusting impedance).

In contrast, the characteristic impedance of Pair 3 may tend to exceed 100 ohms throughout much of the mated plug-jack connection. This may occur, for example, because the plug blades and jackwire contacts for Pair 3 are split apart (since the plug blades and jackwire contacts for Pair 1 are interposed therebetween). At these larger separations, the capacitive and the inductive couplings between the conductors of Pair 3 are lowered. As a result the Pair 3 impedance is driven higher, not only due to the lowered capacitive coupling, but also due to the lowered inductive coupling which causes the pair inductance to be higher.

Each of the differential pairs of conductors in an Ethernet cable are typically designed to have a characteristic impedance of about 100 ohms, and typically these cables may come very close to achieving this desired characteristic impedance value. In order to minimize return loss, a mated plug-jack connection will thus be designed to have an impedance of about 100 ohms when looking into the jack from the Ethernet cable attached thereto and when looking into the plug from the cable of the patch cord. The impedance, when viewed from these two perspectives, will be a function of the impedances of the individual sections within the mated plug-jack connection, with the impedance values of the sections, and the lengths of the segments driving the overall impedance value. The sections closest to the interface contribute most strongly to the impedance value seen looking into the mated plug-jack connection from these two locations.

Pursuant to embodiments of the present invention, communications connectors are provided that have low impedance transmission line sections implemented in a printed circuit board thereof that may improve the return loss performance of the connector. In some embodiments, these low impedance transmission line sections are created by transitioning the first signal current carrying conductive path of the transmission line to an interior layer of the printed circuit board, and then routing the first and second signal current carrying paths of the differential transmission line in a vertically stacked arrangement. Conductive trace segments of the first and second signal current carrying conductive paths of a differential transmission line are referred to herein as being routed in a "vertically stacked" arrangement if the conductive trace segments are on different layers of a printed circuit board, at least partially overlap along an axis that is perpendicular to a major surface of the printed circuit board, and extend in the same general direction for a distance that is at least twice an average width of at least one of the first conductive trace segment or the second conductive trace segment. The portions of the signal current carrying conductive paths that form the low impedance section of the differential transmission line may be positioned on adjacent layers of the printed circuit board that are in close proximity to each other so that the signal current carrying conductive paths will have a relatively high level of capacitive coupling. The extent to which the low impedance section of the transmission line lowers the impedance of the transmission line may be controlled by, for example, varying the widths of the conductive trace segments, the amount that the conductive trace segments overlap, the distance between the conductive trace segments, the length for which the conductive trace segments are vertically stacked and the dielectric constant of the intervening dielectric layer of the printed circuit board.

Referring again to FIGS. 4A-4B, it can be seen that low impedance sections 137 are provided along two of the differential transmission lines through the printed circuit board 130 of jack 100. In particular, a first low impedance section 137-1 is provided on the transmission line for Pair 1, and a second low impedance section 137-2 is provided on the transmission line for Pair 3. These low impedance sections may be located adjacent to the IDCs 150, as is shown in FIG. 4A.

Figure 5A:
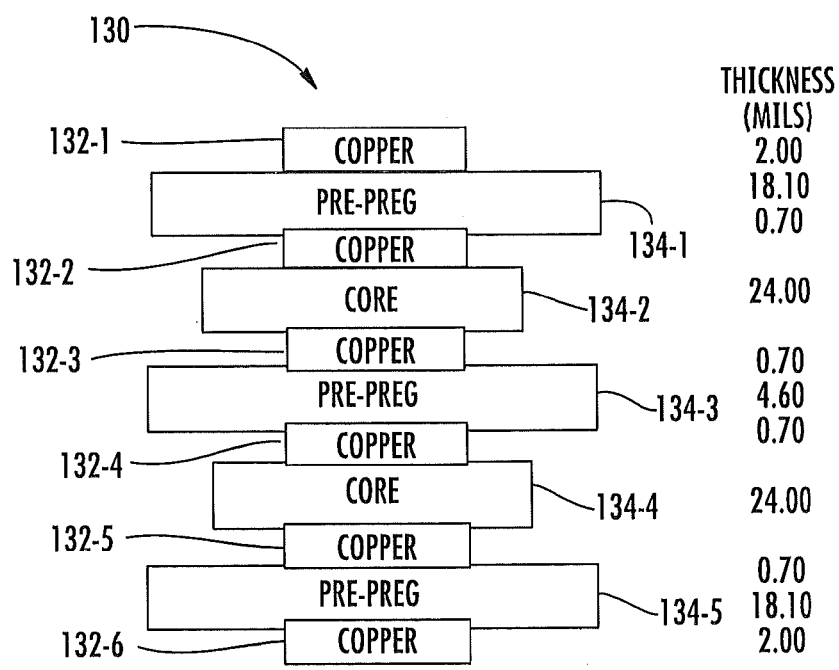
FIG. 5A is a side view of the printed circuit board of the communications insert of FIGS. 4A and 4B.
Figure 5B:
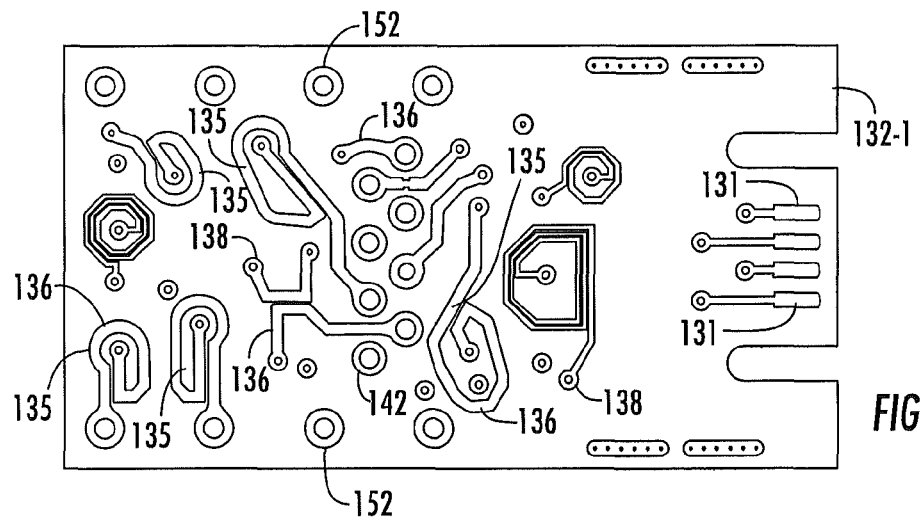
FIGS. 5B-5H are plan views of the conductive layers of the printed circuit board of FIG. 5A.
Figure 5C:
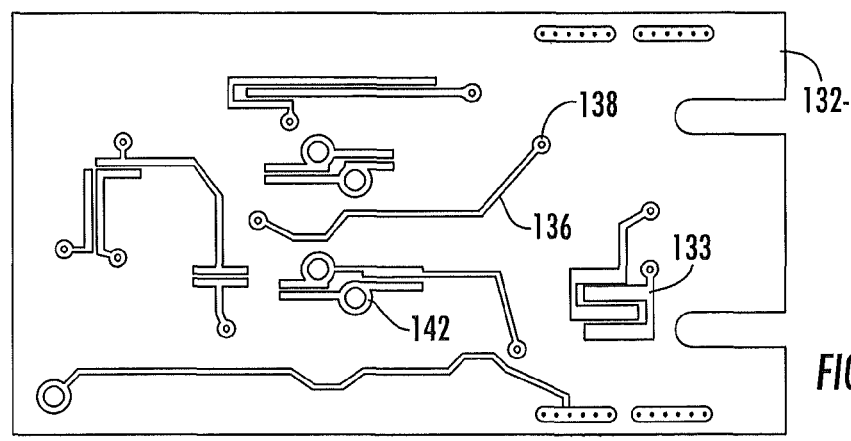
Figure 5D:
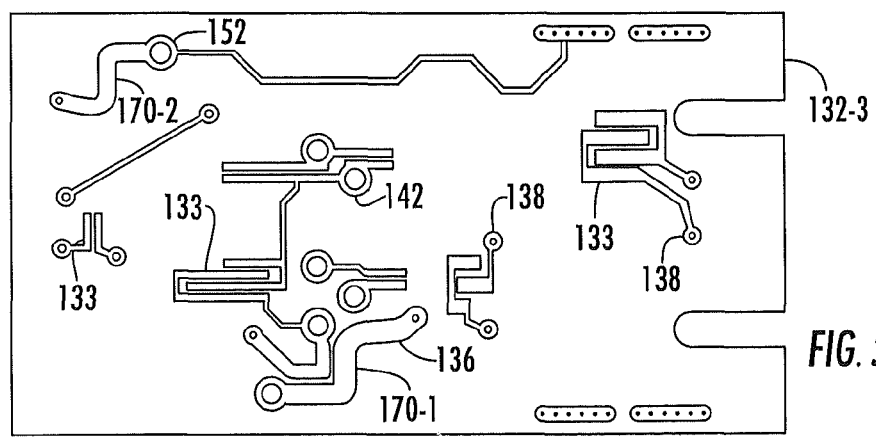
Figure 5E:
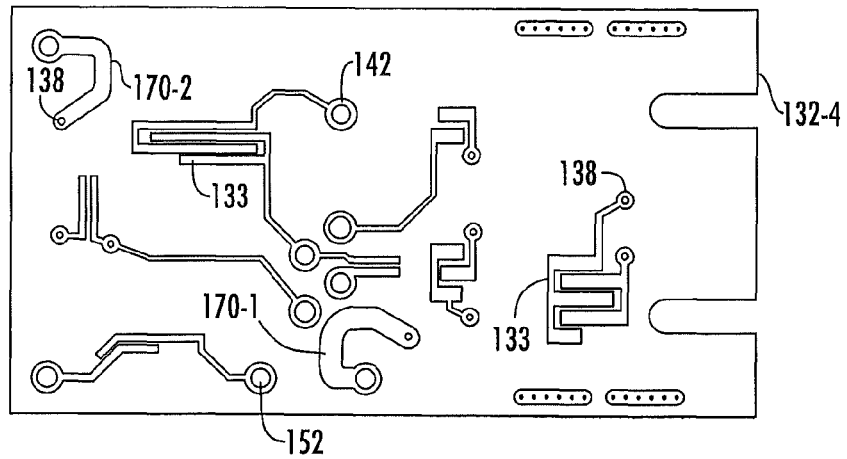
Figure 5F:
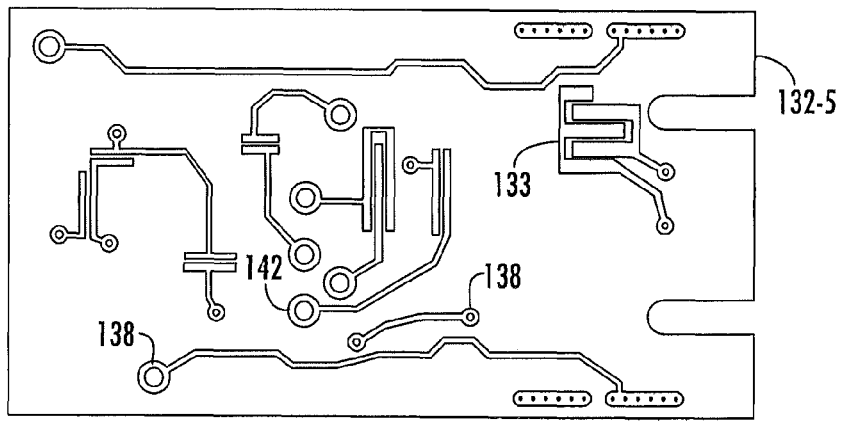
Figure 5G:
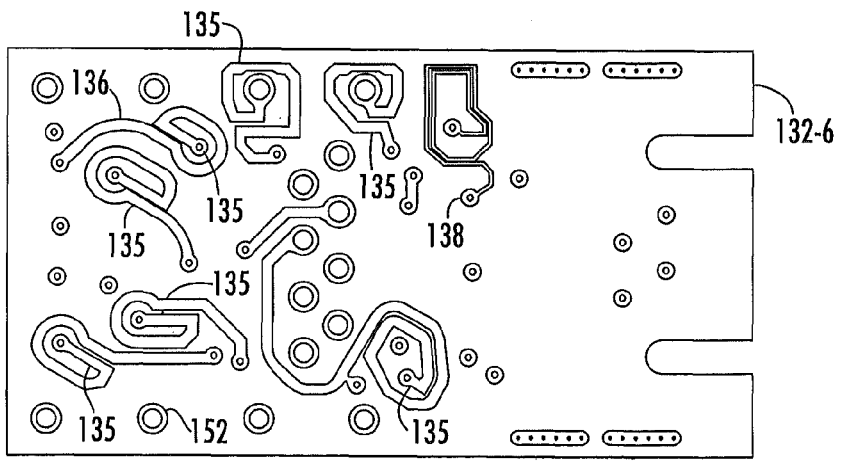
Figure 5H:
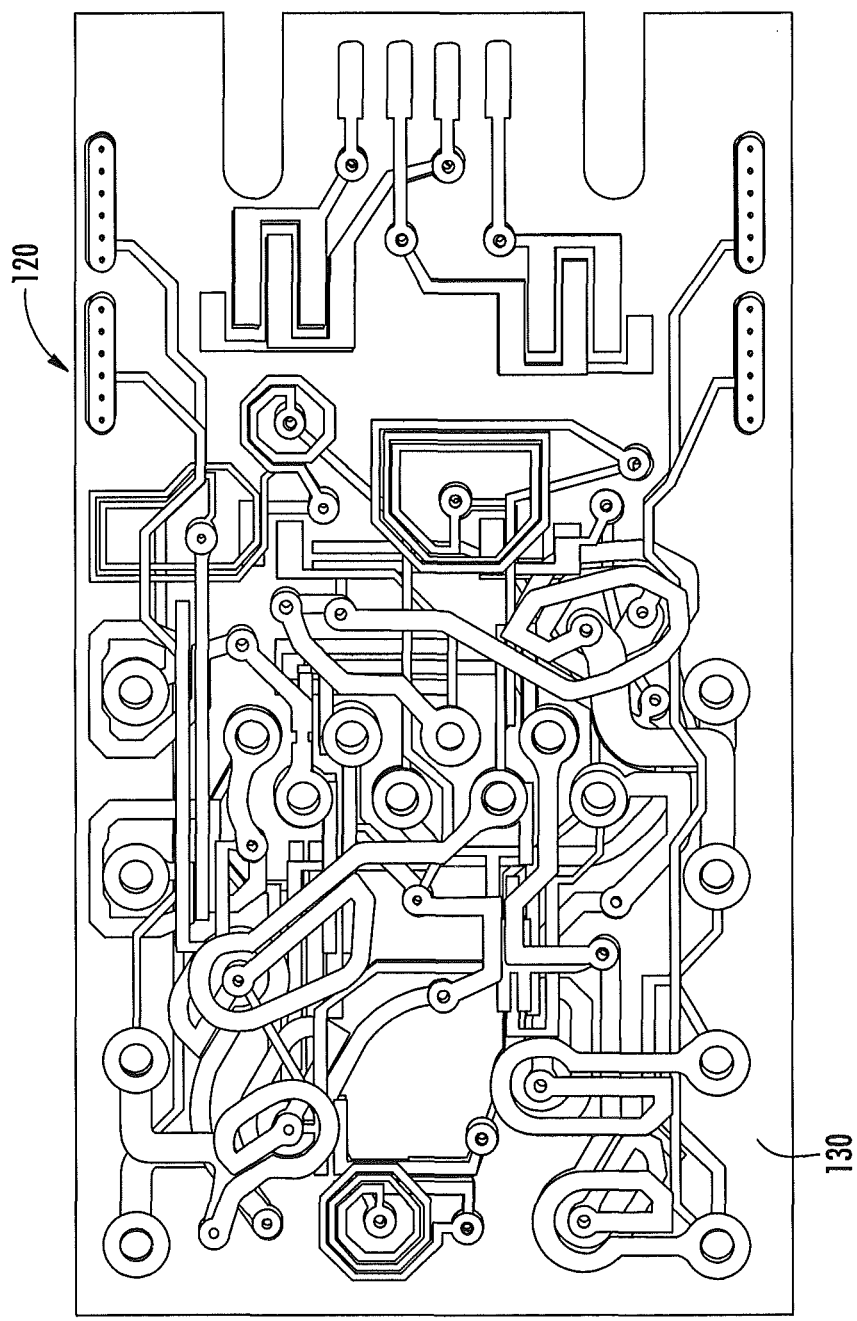

Referring now to FIGS. 5A-5H, it can be seen that the printed circuit board 130 is a multi-layer printed circuit board that includes six conductive layers 132-1 through 132-6 and five dielectric layers 134-1 through 134-5. FIG. 5A is a side view of the printed circuit board 130 that illustrates the relative positioning of the eleven layers 132, 134 and the thickness of each layer. FIGS. 5B-5G are plan views of the six conductive layers 132 of printed circuit board 130 that illustrate the conductive paths and structures included on each of the six conductive layers 132. FIG. 5H is a view from the top of the printed circuit board that looks through the six conductive layers 132-1 through 132-6, starting with layer 132-1 on top (and thus, for example, the conductive structures on layer 132-1 block the view of conductive structures on lower ones of the conductive layers 132).

The metal-plated vias 142 and 152 that receive the jackwire contacts 140 and the IDCs 150 are shown in FIGS. 5B-5G. The eight metal-plated vias labeled 142 that are positioned in a central region of the printed circuit board 130 hold the base ends of the eight jackwire contacts 140, while the eight metal-plated vias 152 that are positioned in two rows of four along the side edges of the printed circuit board 130 hold the base ends of the eight IDCs 150.

As further shown in FIGS. 5B-5G, the conductive layers 132 of the printed circuit board 130 include a plurality of conductive trace segments 136. A plurality of conductive plugs 138 are also provided that extend vertically through the printed circuit board 130. The conductive plugs 138 electrically connect conductive trace segments 136 (or other conductive structures such as capacitor electrodes) on one of the conductive layers 132 of the printed circuit board 130 to conductive traces 136 or other structures on a different conductive layer 132 of the printed circuit board 130, as is known to those of skill in the art.

The conductive layers 132 further include conductive structures such as surface contact pads 131, interdigitated finger and plate capacitors 133 that provide crosstalk compensation, and inductive self-coupling sections 135 along the signal carrying conductive paths that are provided to form high impedance sections along various of the differential transmission lines. The surface contact pads 131 connect the distal ends of various of the jackwire contacts 140 to crosstalk compensation capacitors 133 that are implemented in the interior conductive layers 132 of the printed circuit board 130. The inductive self-coupling sections 135 comprise spirals that are included along various of the signal current carrying conductive paths. These inductive self-coupling sections 135 are discussed in greater detail herein.

As shown in FIGS. 4B and 5D-5E, the differential transmission lines for Pairs 1 and 3 through printed circuit board 130 each includes a low impedance section 137 according to embodiments of the present invention. In particular, the transmission line for Pair 1 includes the low impedance section 137-1 that is implemented as vertically stacked conductive trace segments on conductive layers 132-3 and 132-4 that overlap in the vicinity of the IDCs 150-4 and 150-5 for Pair 1. The transmission line for Pair 3 includes the low impedance section 137-2 that is implemented as vertically stacked conductive trace segments on conductive layers 132-3 and 132-4 that overlap in the vicinity of the IDCs 150-3 and 150-6 for Pair 3.

Referring to FIG. 5A, it can be seen that conductive layers 132-3 and 132-4 are separated by a very thin (only 4.6 mil thick) dielectric layer 134-3. As a result, the conductive trace segments that form the low impedance sections 137-1 and 137-2 will exhibit a high degree of capacitive as well as inductive coupling, with both couplings contributing to lowering the impedance of the transmission line. Moreover, the conductive trace segments that form the low impedance transmission line sections 137-1 and 137-2 are also widened trace segments, which tends to further lower the impedance in these sections of the transmission lines for Pairs 1 and 3.

Notably, the low impedance sections 137-1 and 137-2 are formed using conductive trace segments that are part of the signal current carrying paths of the differential transmission lines for Pairs 1 and 3. Consequently, no additional area of the printed circuit board is required to implement these low impedance sections, as would be the case if capacitors were formed between the two conductive paths of each differential transmission line.

As shown in FIGS. 4B and 5G, conductive paths 160-3 through 160-6, each include one or more inductively self-coupling sections 135 that are immediately adjacent each other and that run generally parallel to each other. Moreover, the current flowing in these inductively self-coupling sections 135 will have generally the same instantaneous current direction as each of the conductive paths 160-3 through 160-6 winds back around itself to form the inductively self-coupling sections 135. Because these trace segments have generally the same instantaneous current direction and are closely spaced to each other, the trace segments inductively self-couple to form the inductively self-coupling sections 135 (i.e., a localized increase in inductance is triggered in these sections 135). This localized increase in inductance tends to increase the impedance of Pair 3 that the conductive paths 160-3 and 160-6 form. The sections 135 need not run exactly parallel to each other, but should run together in similar directions for lengths that are substantially greater than the widths of the conductive paths to generate a useful increase in inductance. In the depicted embodiment, some of the inductive self-coupling sections 135 are formed using spiral structures, which can be very effective at generating a significant increase in inductance along a transmission line in a small space. Other of the inductive self-coupling sections 135 are formed using simply loops in selected of the signal current carrying conductive paths 160 that allow two segments of the same signal current carrying conductive path 160 to run next to each other such that the segments have the same or similar instantaneous current directions. Still other implementations are possible. Typically inductive self-coupling sections will be provided on both conductive paths of a transmission line so that the conductive paths may have approximately equal lengths. The inductive self-coupling sections 135 may form high impedance sections 135 along the differential transmission lines.

In some embodiments of the present invention, characteristics of the low impedance sections 137 and the high impedance sections 135 along a differential transmission line may be selected to create impedance resonances that may affect the return loss spectrum of the differential transmission line (i.e., the return loss plotted as a function of frequency). These resonances (including the frequency range over which the resonances occur) may be tuned to enhance the return loss of the transmission line within a desired range of frequencies without unacceptably degrading other characteristics of the differential transmission line. The resonant frequencies are not necessarily within the range of frequencies within which return loss and/or insertion loss is enhanced. The characteristics of the low impedance sections 137 and the high impedance sections 135 that may be adjusted to create and tune the resonances include the magnitudes of the capacitive and inductive couplings of each section 137, 135, the distance between the sections 137, 135, and the distance of the sections 137, 135 from other low or high impedance sections of the differential transmission line such as, for example, crosstalk compensation capacitors.

In some embodiments, differential transmission lines may be provided that have a first, low impedance section that is formed by routing at least one of the signal current carrying conductive paths of the transmission line onto an internal layer of a printed circuit board so that it exhibits increased capacitive coupling with the other signal current carrying path of the transmission line such that this first section of the transmission line has a characteristic impedance that is at least twenty percent below a pre-selected impedance (e.g., 100 ohms). The differential transmission line may also have a second, high impedance, inductive self-coupling section that has a characteristic impedance that is at least twenty percent above the pre-selected impedance. The first low impedance section may be adjacent the output terminals of the connector (e.g., the IDCs of a communications jack), and the second section may be between the input terminals of the connector and the first section. The first and second sections may be directly adjacent to each other.

Figure 10:
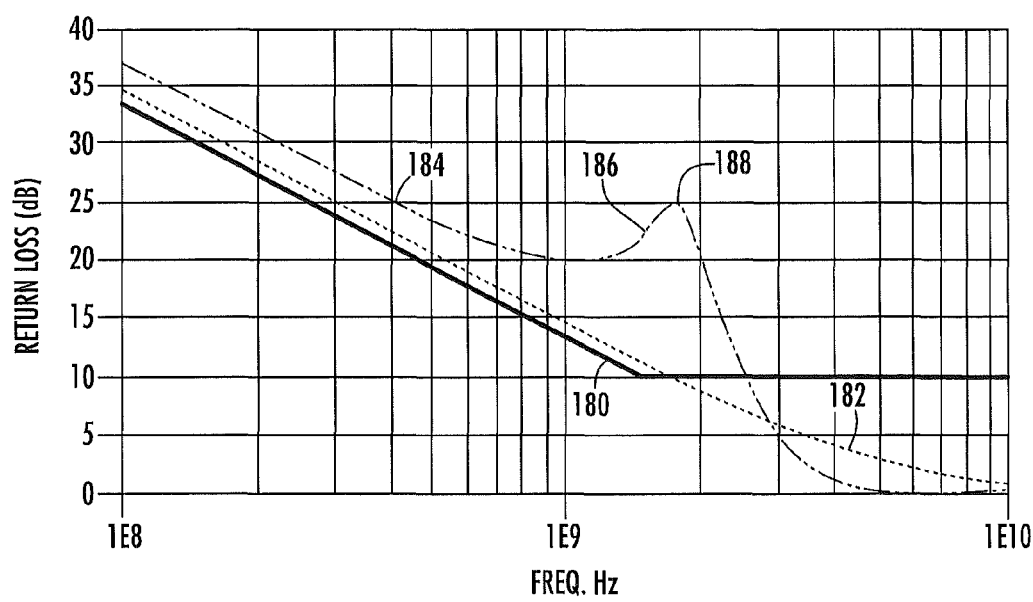
FIG. 10 is a graph illustrating how the techniques according to embodiments of the present invention may be used to generate a local maximum in the return loss spectrum that may be used to provide enhanced return loss performance over a frequency range of interest.

As noted above, the industry standards typically specify the return loss requirements as a function of frequency. FIG. 10 is an example graph that illustrates a hypothetical minimum return loss requirement (curve 180). In the example of FIG. 10, the hypothetical return loss standard drops at a rate of 20 dB/decade for frequencies between 100 MHz and 1.5 GHz, and then remains flat at frequencies above 1.5 GHz. In many cases, communications connectors may exceed the return loss requirements for all frequencies of interest. When they do not, it is most typical that the return loss will tend to fail the return loss requirements at either (1) low frequencies or (2) at or near the maximum operating frequencies for the connector. Generally speaking, increasing the capacitive coupling between the two conductors of a differential transmission line tends to improve the return loss at high frequencies while degrading the return loss at lower frequencies. Conversely, increasing the pair inductance of a differential transmission line tends to improve the return loss at low frequencies while degrading the return loss at higher frequencies. If a connector fails to meet the return loss specifications at one of low frequencies or high frequencies, but has significant return loss margin at the other, it is often possible to simply increase the pair inductance of the differential transmission line or the capacitive coupling between its two conductive paths to meet the return loss specifications (i.e., by giving up return loss margin at one of high frequencies or low frequencies, improved return loss performance may be gained at the other of high frequencies or low frequencies).

In some cases, however, a communications jack or plug may fail to meet the return loss specifications at both low and high frequencies, or may fail the specifications at one of the two and have little margin at the other. In such cases, simply increasing the pair inductance of the differential transmission line or the capacitive coupling between its two conductive paths typically will not achieve the goal of meeting the return loss specifications at all frequencies in a specified operating range of the connector. By creating resonances in the return loss spectrum in the manner discussed above, it is often possible to improve the return loss across much or all of an operating frequency band, while creating wider swings in the return loss at other frequencies. Standard simulation techniques may be used to design the characteristics of the low impedance and high impedance sections 137, 135 that will create resonances that improve the return loss in a frequency band of interest (typically the specified operating frequency band for the connector). In some cases, the resonances may create a local maximum in the return loss spectrum for the transmission line. In many cases it may be advantageous to tune the connector so that this local maximum is in the upper portion of the frequency range for which the transmission line is designed to operate or just outside that frequency range, which technique may be used to effectively extend (to higher frequencies) the frequency range over which the transmission line may provide suitable return loss performance.

Referring again to FIG. 10, curve 182 illustrates the return loss of a transmission line through a jack as might occur without using the techniques according to embodiments of the present invention. As shown in this example, the return loss actually meets the standard at all frequencies below about 1.7 GHz, but then fails to meet the standard at all higher frequencies. If resonances are introduced in the transmission line, the return loss spectrum for the connector may be modified as shown in curve 184, where the return loss is improved up to frequencies of about 2.9 GHz, but then degraded at higher frequencies, As can be seen in FIG. 10, the return loss spectrum has a peak 186 that extends from about 1.2 GHz to about 2.2 GHz. This peak 186 defines a local maximum 188 in the return loss (which has in this case the an absolute maximum margin above the standard) at about 1.8 GHz. The example of FIG. 10 illustrates why it may be beneficial to locate the local maximum 188 in the return loss near a maximum operating frequency for the connector. In some embodiments, the local maximum may be positioned at a frequency that is at least half the maximum operating frequency for the connector but no more than 50% higher than the maximum operating frequency for the connector. The maximum operating frequency for the communications connector may be located within the peak 186 of the return loss spectrum In some embodiments, the low impedance section of a transmission line may be a section where the capacitive reactance for the transmission line segment exceeds the inductive reactance for the transmission line segment. As is known to those of skill in the art, the capacitive reactance $X_C$ for a pair of conductors (such as the two conductors of a differential transmission line) is defined as:

$$X_C = 1/2\pi f C \qquad (1)$$

where f is the frequency and the C is the capacitance. The capacitive reactance $X_C$ is expressed in units of ohms. The inductive reactance $X_L$ for a pair of conductors is defined as:

$$X_L = 2\pi f L \qquad (2)$$

where f is the frequency and the L is the inductance. The inductive reactance $X_L$ is also expressed in units of ohms. A transmission line segment will exhibit a distributed capacitive reactance and a distributed inductive reactance which refer to the capacitive reactance per unit length and the inductive reactance per unit length, respectively, for the transmission line segment at issue. Pursuant to some embodiments of the present invention, the low impedance transmission line segments may be segments where the distributed capacitive reactance exceeds the distributed inductive reactance for the transmission line segment.

In some embodiments, the low impedance sections on a differential transmission line may be formed by routing at least one of the conductive traces to an interior conductive layer of the printed circuit board. As is known to those of skill in the art, a common thickness for a conventional rigid printed circuit boards is about 62 mils. Such a thickness may be too large to obtain sufficient capacitive coupling between conductive traces on the top and bottom layers of the printed circuit board in order to lower the impedance of a transmission line. Accordingly, in some embodiments of the present invention, at least one of the conductive traces may be located on an interior layer of the printed circuit board. In order to meet current testing requirements for the jacks (e.g., the 7 Amp test specified in UL 1863), it may be necessary to widen the trace(s) that are provided on the interior conductive layers of the printed circuit board as heat does not dissipate as well from these interior layers, and hence large current densities may cause excessive heating that can damage the printed circuit board. Fortunately, however, increasing the trace width also tends to increase the capacitive coupling between the two conductive paths of the transmission line, and hence is consistent with the goal of forming a low impedance section in the differential transmission line.

It will be appreciated that the low impedance transmission line sections according to embodiments of the present invention may be implemented in numerous different ways. FIGS. 6A-6F illustrate example implementations. FIGS. 6A-6F are each schematic plan views of a portion of two conductive layers of a printed circuit board that illustrate the relative positioning of the conductive traces of the transmission line segments that may be used to form various low impedance transmission line sections according to embodiments of the present invention. In FIGS. 6A-6F, the differently hatched areas are conductive traces that reside on different layers of the printed circuit board. At least one of the layers is an internal layer of the printed circuit board.

Figure 6A:
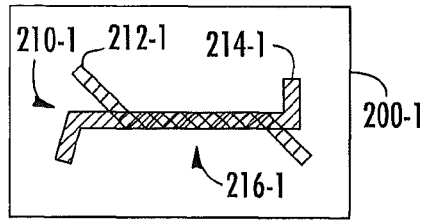
FIGS. 6A-6F are enlarged, schematic plan views of portions of printed circuit boards of communications connector according to embodiments of the present invention that illustrate example techniques for providing low impedance transmission line segments.
Figure 6B:
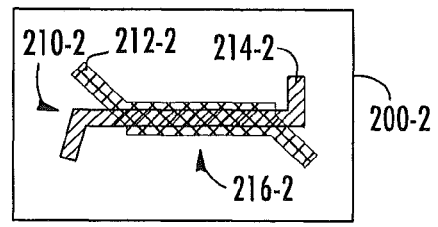
Figure 6C:
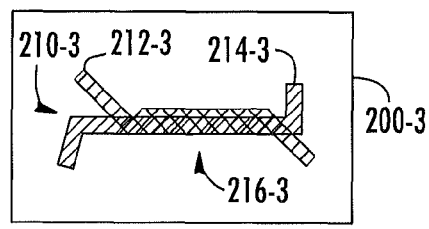

FIG. 6A illustrates a first example in which the two conductive traces 212-1, 214-1 of a transmission line 210-1 are provided on adjacent conductive layers of a printed circuit board 200-1 to provide a low impedance transmission line section 216-1. In the embodiment of FIG. 6A, the two conductive traces 212-1, 214-1 are routed in a vertically stacked arrangement so as to completely overlap. The two conductive traces 212-1, 214-1 also have identical widths. FIG. 6B illustrates a second example in which the two conductive traces 212-2, 214-2 of a transmission line 210-2 are again routed in a vertically stacked arrangement on adjacent conductive layers of a printed circuit board 200-2 to provide a low impedance transmission line section 216-2. In the embodiment of FIG. 6B, the traces 212-2, 214-2 are widened in the region where the traces are vertically stacked. FIG. 6C illustrates a third example in which the two conductive traces 212-3, 214-3 of a transmission line 210-3 are routed in a vertically stacked arrangement on adjacent conductive layers of a printed circuit board 200-3 to provide a low impedance transmission line section 216-3. However, in the embodiment of FIG. 6C, the traces 212-3, 214-3 are not completely overlapping, but instead are only partially overlapping in the low impedance section 216-3.

Figure 6E:
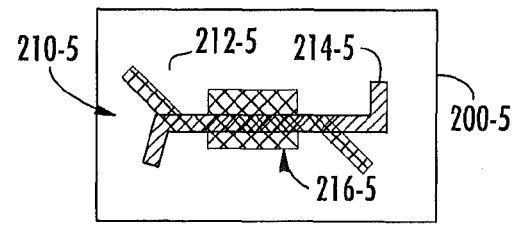
Figure 6D:
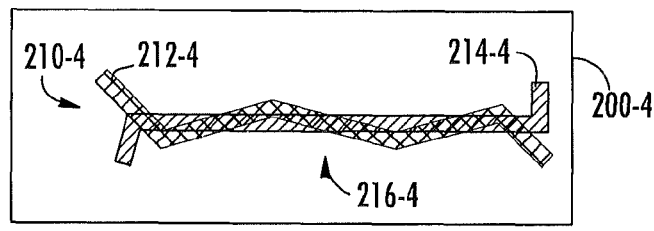
Figure 6F:
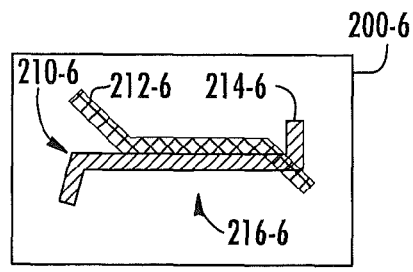

FIG. 6D illustrates a fourth example in which the two conductive traces 212-4, 214-4 of a transmission line 210-4 are routed in a vertically stacked arrangement on adjacent conductive layers of a printed circuit board 200-4 to provide a low impedance transmission line section 216-4. In the embodiment of FIG. 6D, conductive trace 214-4 is linear in the low impedance section, while conductive trace 212-4 is routed in a zig-zag pattern to extend in generally the same direction as conductive trace 214-4 and to have significant overlap with it. FIG. 6E illustrates a fifth example in which the two conductive traces 212-5, 214-5 of a transmission line 210-5 each include widened regions that are vertically stacked on adjacent conductive layers of a printed circuit board 200-5 to provide a low impedance transmission line section 216-5. Finally, FIG. 6F illustrates a sixth example in which the two conductive traces 212-6, 214-6 of a transmission line 210-6 are routed on adjacent conductive layers of a printed circuit board 200-6 to provide a low impedance transmission line section 216-6. In the embodiment of FIG. 6F, the traces 212-6, 214-6 do not quite overlap when viewed from above, but may be sufficiently close to each other that the capacitive reactance between the conductive traces 212-6, 214-6 exceeds their inductive reactance. It will be appreciated that the techniques for providing the low impedance section illustrated in the example embodiments of FIGS. 6A-6F may be combined to create additional embodiments. It will also be appreciated that the embodiments of FIGS. 6A-6F are exemplary in nature and that many other implementations are possible.

Figure 11:
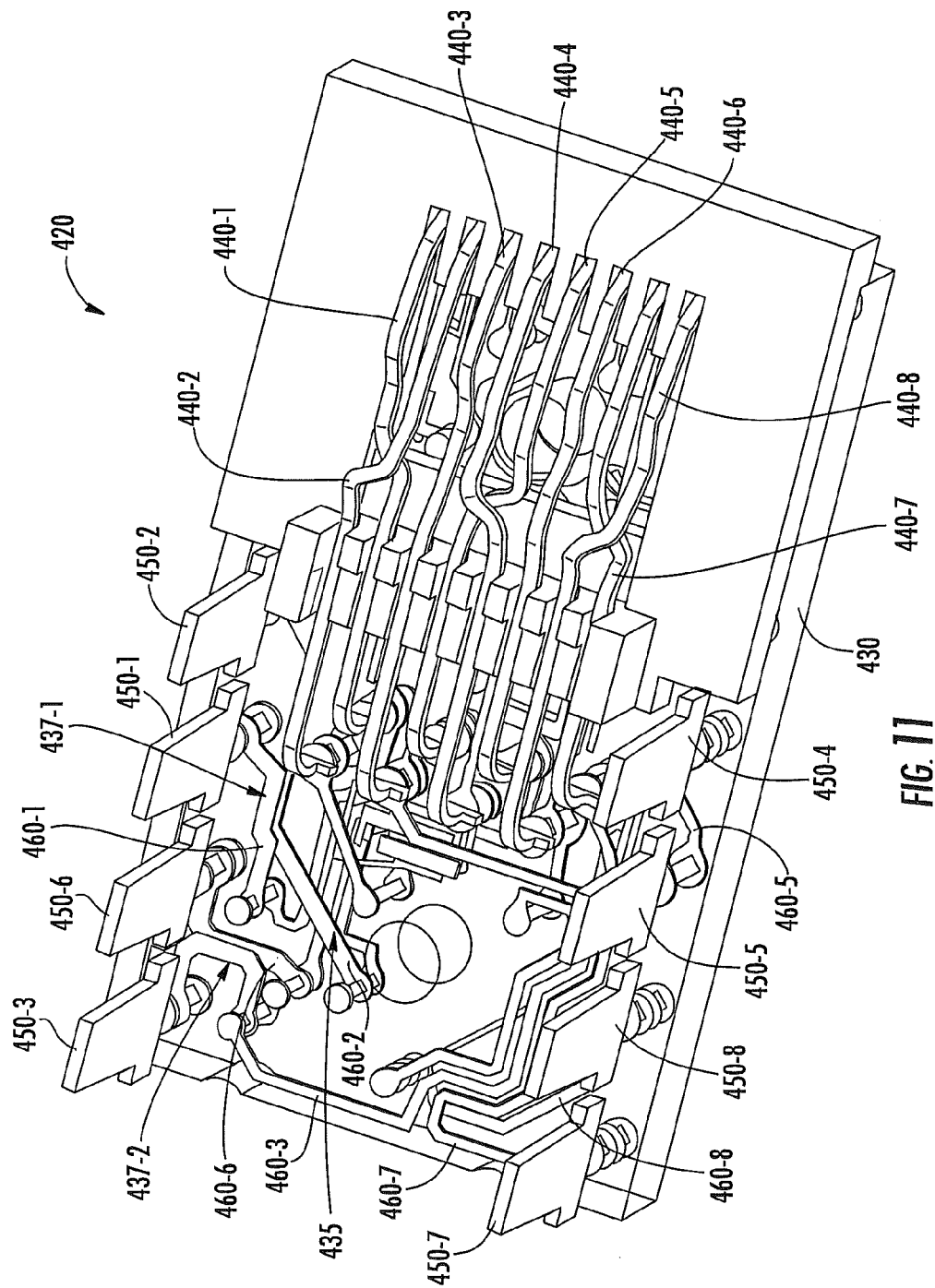
FIG. 11 is a perspective view of a communications insert of a communications jack according to further embodiments of the present invention.

FIG. 11 is a perspective view of a communications insert 420 of a communications jack according to further embodiments of the present invention. The communications insert 420 may be used, for example, in the housing 110 of jack 100. As shown in FIG. 11, the communications insert 420 includes a printed circuit board 430, eight jackwire contacts 440-1 through 440-8, and eight wire connection terminals 450-1 through 450-8 in the form of IDCs. The jackwire contacts 440-1 through 440-8, and eight IDCs 450-1 through 450-8 may be similar to the corresponding jackwire contacts and IDCs illustrated in the jack 100 discussed above, and hence will not be described separately. However, as can be seen in FIG. 11, the jackwire contacts 440-1 through 440-8 have a different crossover configuration as compared to the jackwire contacts 140-1 through 140-8 of the jack 100. The printed circuit board 430 may comprise a substrate that includes a plurality of stacked dielectric layers and conductive layers and may, for example, have the configuration illustrated in FIG. 5A.

The printed circuit board 430 further includes a plurality of signal current carrying conductive paths 460-1 through 460-8 (460-4 is not visible in FIG. 11), each of which electrically connects a respective one of the jackwire contacts 440-1 through 440-8 to a respective one of the IDCs 450-1 through 450-8. Each signal current carrying conductive path 460 may include one or more conductive segments that may be provided on different layers of the printed circuit board 430, and may include conductive layer connection structures such as conductive vias that electrically connect conductive segments that are on different layers of the printed circuit board 430. The printed circuit board 430 may also include electrical circuit elements such as capacitors and/or inductive coupling sections that are arranged on or within the board to compensate for crosstalk. Most of these circuit elements are not shown in FIG. 11 to simplify the drawing.

As shown in FIG. 11, low impedance sections 437-1, 437-2 are provided on the printed circuit board 430 for the transmission lines of Pairs 2 and 3, respectively. As in the embodiment of FIGS. 3-5, the low impedance transmission line sections are created by transitioning the first signal current carrying conductive path of a differential transmission line to an interior layer of the printed circuit board, and then routing the first and second signal current carrying paths of the differential transmission line in a vertically stacked arrangement.

In addition, the differential transmission line for Pair 2 further includes a section 435 where conductive paths 460-1 and 460-2 are spaced more widely apart on the same layer of the printed circuit board 430. This arrangement tends to increase the impedance of Pair 2 so that section 435 comprises a high impedance section along the differential transmission line. Similar to the discussion above with respect to jack 100, in some embodiments, characteristics of the low impedance section 437-1 and the high impedance section 435 along the differential transmission line 460-1, 460-2 may be selected to create impedance resonances that may affect the return loss spectrum of the differential transmission line, which resonances may be tuned to enhance the return loss of the transmission line within a desired range of frequencies.

In some embodiments, the low impedance section 437-1 may have a characteristic impedance that is at least twenty percent below a pre-selected impedance (e.g., 100 ohms), while the high impedance section 435 may have a distributed characteristic impedance that is at least twenty percent above the pre-selected impedance. The low impedance section 437-1 may be adjacent the output terminals of the connector (e.g., the IDCs of a communications jack), and the high impedance section 435 may be between the input terminals of the connector and the first section. The first and second sections may be directly adjacent to each other.

Figure 7:
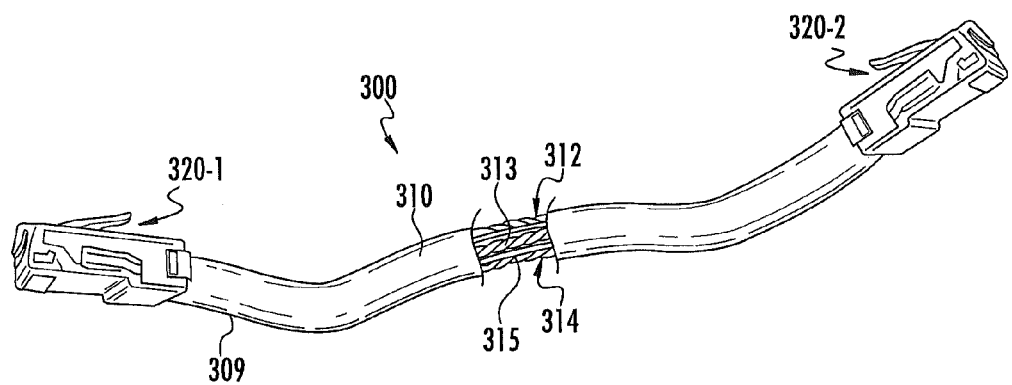
FIG. 7 is a perspective view of a patch cord according to embodiments of the present invention.
Figure 8:
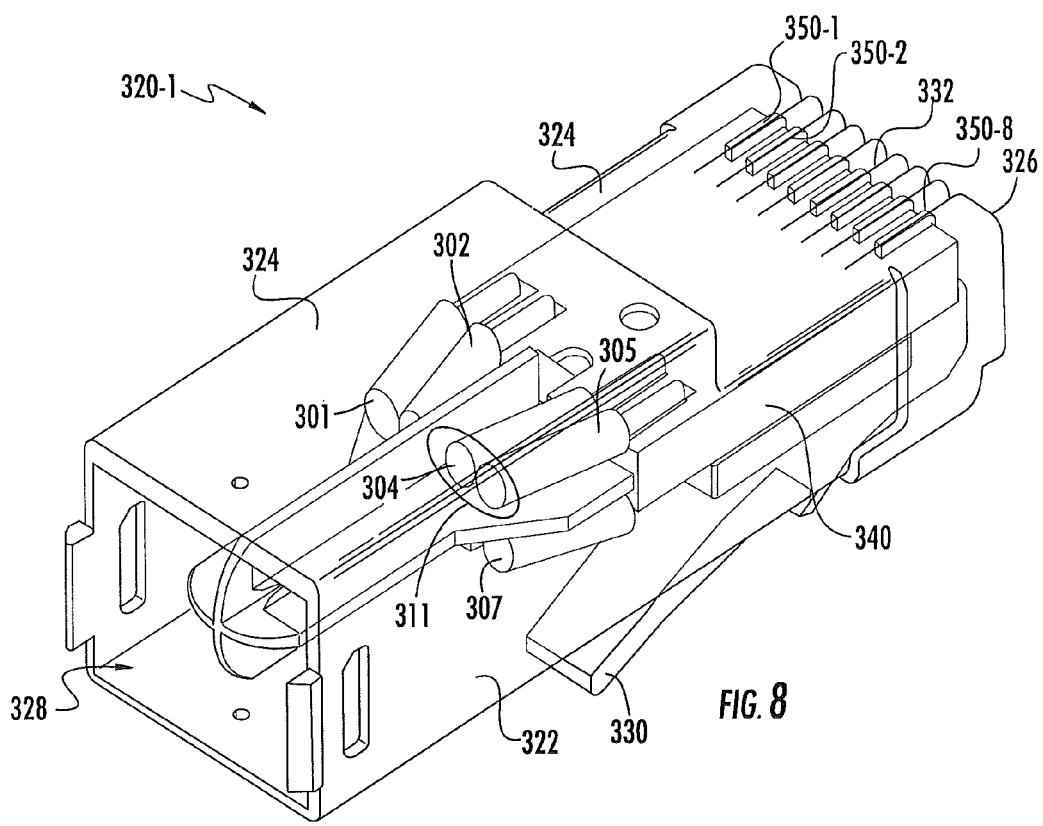
FIG. 8 is a perspective view of a communications plug that is included in the patch cord of FIG. 7.
Figure 9:
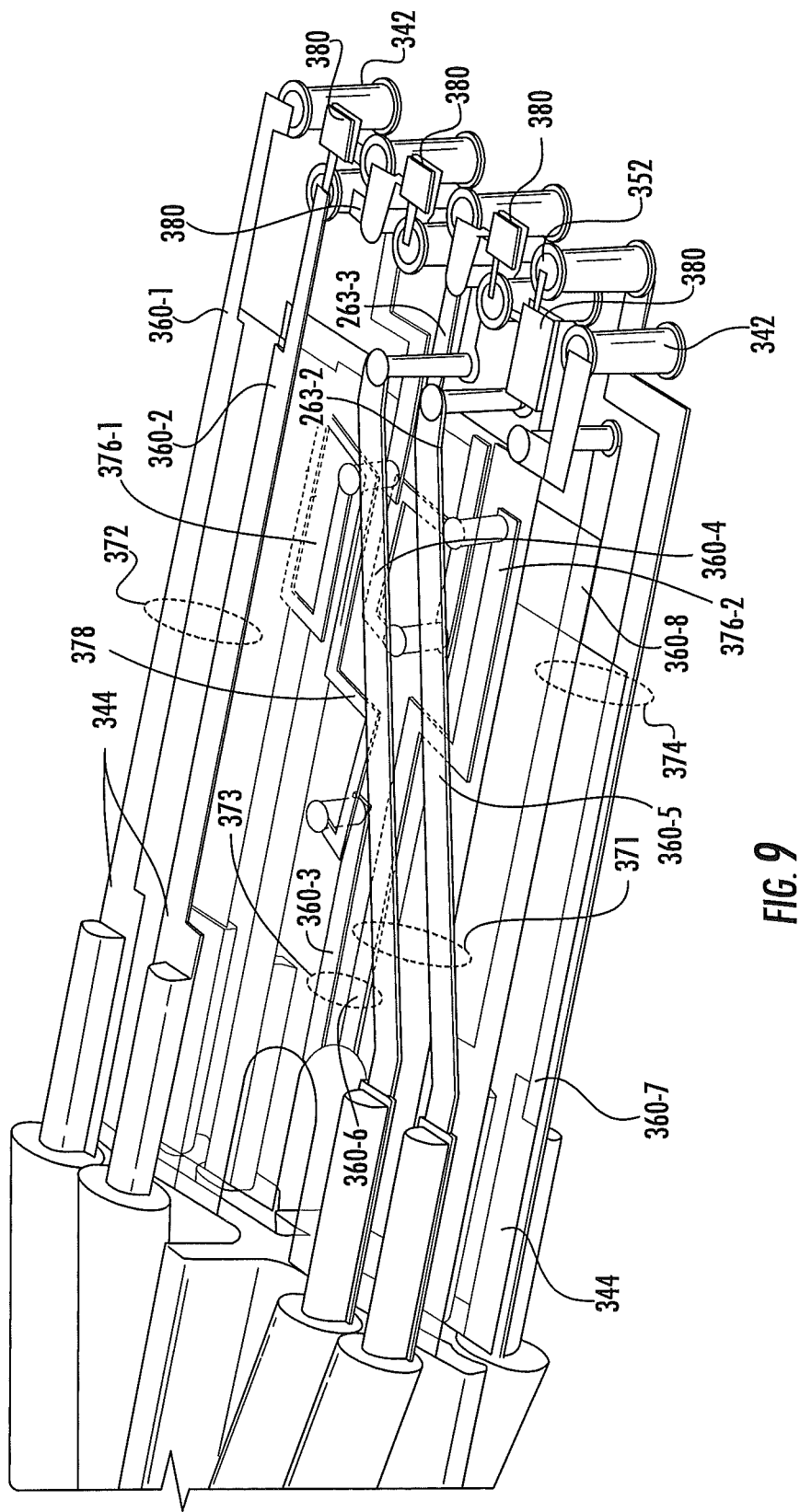
FIG. 9 is a perspective view of a printed circuit board of the plug of FIG. 8 that includes a low impedance transmission line segment according to embodiments of the present invention.

As noted above, the techniques according to embodiments of the present invention may be implemented in both communications jacks and plugs. FIGS. 7-9 illustrate a patch cord 300 that includes plugs 320 according to embodiments of the present invention. In particular, FIG. 7 is a perspective view of the patch cord 300, FIG. 8 is a top-rear perspective view of one of the plugs 320, and FIG. 9 is a perspective artwork view of a printed circuit board 340 of the plug the 320.

As shown in FIG. 7, the patch cord 300 includes a cable 309 that has eight insulated conductors 301-308 enclosed in a jacket 310 (the conductors 301-308 are not individually numbered in FIG. 7, and not all of the conductors 301-308 are visible in FIGS. 7 and 8). The insulated conductors 301-308 may be arranged as four twisted pairs of conductors 311-314 (pair 311 is not visible in FIG. 7, but shown in FIG. 8), with conductors 304 and 305 twisted together to form twisted pair 311, conductors 301 and 302 twisted together to form twisted pair 312, conductors 303 and 306 twisted together to form twisted pair 313, and conductors 307 and 308 twisted together to form twisted pair 314. Each twisted pair 311-314 forms a differential transmission line. A separator 315 such as a tape separator or a cruciform separator may be provided that separates one or more of the twisted pairs 311-314 from one or more of the other twisted pairs 311-314. A first plug 320-1 is attached to a first end of the cable 309 and a second plug 320-2 is attached to the second end of the cable 309 to form the patch cord 300.

FIG. 8 is an enlarged view that illustrates the first plug 320-1 in greater detail. In order to simplify the drawing, a rear cap of the plug housing, various wire grooming and wire retention mechanisms and a strain relief boot are omitted from FIG. 8. As shown in FIG. 8, the plug 320-1 includes a housing 322 that has a top face 324, a front face 326 and a rear opening 328 that receives a rear cap (not shown). A plug latch 330 extends from a bottom face of the housing. The top and front faces 324, 326 of the housing 322 include a plurality of longitudinally extending slots 332. The communications cable 309 (see FIG. 7) is received through the rear opening 328. A rear cap (not shown) that includes a cable aperture locks into place over the rear opening 328 of housing 322 after the communications cable 309 has been inserted therein.

As is also shown in FIG. 8, the plug 320-1 further includes a printed circuit board 340 which is disposed within the housing 322, and a plurality of plug blades 350-1 through 350-8 are mounted at the forward edge of the printed circuit board 340 so that the blades 350 can be accessed through the slots 332 in the housing 322. Any conventional housing 322 may be used that is configured to hold the printed circuit board 340, and hence the housing 322 is not described in further detail herein.

The printed circuit board 340 may comprise, for example, a conventional rigid printed circuit board or a flexible printed circuit board. In the depicted embodiment, the printed circuit board 340 comprises a conventional multi-layer rigid printed circuit board.

The plug blades 350 are configured to make mechanical and electrical contact with respective contacts, such as, for example, the jackwire contacts, of a mating communications jack. As shown in FIG. 8, each of the eight plug blades 350 is mounted at the front portion of the printed circuit board 340. The plug blades 350 may be substantially transversely aligned in side-by-side relationship. Each of the plug blades 350 includes a first section that extends forwardly along a top surface of the printed circuit board 340, a transition section that curves through an angle of approximately ninety degrees and a second section that extends downwardly from the first section along a portion of the front edge of the printed circuit board 340. The transition section may include a curved outer radius that complies with the specification set forth in, for example, IEC 60603-7-4 for industry standards compliant plug blades.

Each of the plug blades 350 may be fabricated separately from the printed circuit board 340. In the depicted embodiment, each of the plug blades 350 comprise, for example, an elongated metal strip having a length of approximately 140 mils, a width of approximately 20 mils and a height (i.e., a thickness) of approximately 20 mils. Each plug blade 350 also includes a base column (not shown) that extends from a bottom surface of the first section of the plug blade (i.e., the section that extends forwardly along the top surface of the printed circuit board 340). The printed circuit board 340 includes eight metal-plated vias 342 (see FIG. 9) that are arranged in two rows along the front edge thereof. The base column 352 of each plug blade 350 is received within a respective one of the metal-plated vias 342 where it may be press-fit, welded or soldered into place to mount the plug blades 350 on the printed circuit board 340.

The plug blades 350 may be mounted to the printed circuit board 340 in other ways. For example, in other embodiments, elongated contact pads may be provided on the top surface of the printed circuit board 340 and each plug blade 350 may be welded or soldered to a respective one of these contact pads. It will be appreciated that many other attachment mechanisms may be used. Additionally, a wide variety of different plug blades may be used instead of the plug blades 350.

Referring to FIG. 9, a plurality of plated pads 344 are provided on the top and bottom surfaces of the printed circuit board 340 along a rear edge thereof. The conductors 301-308 of the cable 309 are terminated onto respective ones of the pads 344 by, for example, soldering. A plurality of conductive paths 360-1 through 360-8 are provided on and/or in the printed circuit board 340. Each of these conductive paths 360 electrically connects one of the plated pads 344 to a respective one of the metal-plated vias 342 so as to provide an electrical path between each of the conductors 301-308 and a respective one of the plug blades 350-1 through 350-8 that are mounted in the metal-plated vias 342. Each conductive path 360 may comprise, for example, one or more conductive traces that are provided on one or more layers of the printed circuit board 340. Metal-plated or metal-filled through holes (or other layer-transferring structures known to those skilled in this art) are provided to electrically connect portions of various of the conductive paths 360 that are on different layers of the printed circuit board 340. The conductive paths 360 are arranged in pairs to form four differential transmission lines 371-374. The two conductive traces 360 that form each of the differential transmission lines 371-374 on the printed circuit board 340 are, with one exception noted below, generally run together, side-by-side, on the printed circuit board 340, which may provide a relatively constant impedance.

A plurality of offending crosstalk circuits are also included on the printed circuit board 340 in the form of capacitors 380 that are interposed between various of the conductive paths 360 adjacent the plug blades 350. The offending crosstalk circuits 380 may be provided, for example, to ensure that the plug 320-1 meets all of the pair-to-pair offending crosstalk specifications required by an industry standards document such as the aforementioned ANSI/TIA-568-C.2 standard. Unfortunately, these offending crosstalk circuits 380 appear as loads along each of the transmission lines 371-374 through the plug 320-1 that may make it difficult for the plug 320-1 to meet target return loss performance specifications, particularly at higher frequencies (e.g., frequencies above 500 MHz, and even more so with respect to frequencies above 1 Ghz or above 1.5 GHz).

As discussed above, the communications connectors according to embodiments of the present invention may include low-impedance transmission line sections that improve the return loss on the transmission lines over a desired frequency range. These low impedance sections may also, in some cases, be placed adjacent to a high impedance section that is formed by, for example, including inductive self-coupling regions in the conductive paths of the transmission line. These low and high-impedance sections may create resonances, and by adjusting the magnitudes of the respective impedances and the distances between the low and high impedance sections (and the distances between these sections and the crosstalk circuits and plug blades) these resonances may be "tuned" to provide improved return loss and/or insertion loss performance for the transmission line over selected frequency ranges.

In the example plug of FIG. 9, transmission line 373 is designed to include low and high-impedance sections that may be tuned to provide improved return loss performance on transmission line 373. In particular, as shown in FIG. 9, on transmission line 373, conductive path 360-3 includes both a spiraled section 376-1 and a low-impedance section 378 where conductive path 360-3 is transitioned to an internal layer of the printed circuit board 340 and routed in a vertically stacked arrangement above conductive path 360-6. Conductive path 360-6 likewise includes a spiraled section 376-2. These low and high-impedance sections may be tuned, for example, to create a local maximum in the return loss spectrum for transmission line 373 near a maximum operating frequency for plug 320-1 (e.g., 500 MHz) which may facilitate ensuring that transmission line 373 meets the return loss specifications set forth in the industry standards.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein the expression "and/or" includes any and all combinations of one or more of the associated listed items. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector comprising:
   a printed circuit board having a first internal conductive layer, a first external conductive layer and a second external conductive layer, the first and second external conductive layers and the first internal conductive layer stacked along a vertical axis with dielectric layers therebetween;
   wherein the printed circuit board includes a plurality of input terminals, a plurality of output terminals and a plurality of signal current carrying conductive paths, each of which electrically connects a respective one of the input terminals to a respective one of the output terminals, the signal current carrying conductive paths arranged in pairs to form a plurality of differential transmission lines, and
   wherein a first signal current carrying conductive path includes a first segment that is on the first internal conductive layer of the printed circuit board which is routed in a vertically stacked arrangement with a second segment of a second signal current carrying conductive path, the first and second signal current carrying conductive paths being part of the same one of the differential transmission lines.

2. The communications connector of claim 1, wherein the communications connector is an RJ-45 plug, the plurality of input terminals comprise first through eighth input terminals that are electrically connected to respective first through eighth plug blades, the plurality of output terminals comprise first through eighth output terminals that are electrically connected to respective first through eighth conductors of a communications cable, the plurality of signal current carrying conductive paths comprise first through eighth signal current carrying conductive paths, and the plurality of differential transmission lines comprise first through fourth differential transmission lines.

3. The communications connector of claim 1, wherein the communications connector is an RJ-45 jack that includes first through eighth jackwire contacts that are electrically connected to respective ones of the plurality of input terminals and first through eighth wire connection terminals that are electrically connected to respective ones of the plurality of output terminals, the plurality of signal current carrying conductive paths comprise first through eighth signal current carrying conductive paths, and the plurality of differential transmission lines comprising first through fourth differential transmission lines.

4. The communications connector of claim 3, wherein the first signal current carrying conductive path includes a first inductive self-coupling section and the second signal current carrying conductive path includes a second inductive self-coupling section.

5. The communications connector of claim 3, wherein the first segment has a first average width that exceeds the average width of the entirety of the first signal current carrying conductive path and/or the second segment has a second average width that exceeds the average width of the entirety of the second signal current carrying conductive path.

6. The communications connector of claim 3, wherein at least one of the signal current carrying conductive paths of the differential transmission line that includes the first and second signal current carrying conductive paths further includes an inductive self coupling section.

7. The communications connector of claim 6, wherein the location and/or magnitude of at least one of the vertically stacked first and second segments or the inductive self-coupling section is selected to provide a local maximum in the return loss spectrum of the differential transmission line that includes the first and second signal current carrying conductive paths, where the maximum in the return loss spectrum is between a first frequency that is half a maximum specified operating frequency for the RJ-45 jack and 1.5 times the maximum specified operating frequency for the RJ-45 jack.

8. A communications connector comprising:
a printed circuit board;
wherein the printed circuit board includes a plurality of input terminals, a plurality of output terminals, and a plurality of signal current carrying conductive paths, each of which electrically connects a respective one of the input terminals to a respective one of the output terminals, the signal current carrying conductive paths arranged in pairs to form a plurality of differential transmission lines, the plurality of differential transmission lines including a first differential transmission line; and
wherein the first and second signal current carrying conductive paths form the first differential transmission line,
wherein the first differential transmission line includes a first section in which a first segment of the first signal current carrying path is routed on a first layer of the printed circuit board and is positioned to capacitively and inductively couple with a second segment of the second signal current carrying path that is routed on a second layer of the printed circuit board that is different than the first layer,
wherein the first section of the first differential transmission line has a characteristic impedance that is at least twenty percent below a pre-selected impedance, and
wherein the first differential transmission line includes a second section that has a second characteristic impedance that is at least twenty percent greater than the pre-selected impedance.

9. The communications connector of claim 8, wherein the locations and/or characteristic impedances of the first and second sections of the first differential transmission line are selected to provide a local maximum in the return loss spectrum for the first differential transmission line that is between a first frequency that is half a maximum specified operating frequency for the communications connector and 1.5 times the maximum specified operating frequency for the communications connector.

10. The communications connector of claim 8, wherein the second section is directly connected to the first section by a third section having an impedance within twenty percent of the pre-selected impedance.

11. The communications connector of claim 8, wherein the pre-selected impedance is 100 ohms.

12. The communications connector of claim 8, wherein the first section is between the second section and the output terminals that are electrically connected to the first differential transmission line.

13. The communications connector of claim 12, wherein the first section comprises a first segment of the first signal current carrying conductive path that is routed in a vertically stacked arrangement with a second segment of the second signal current carrying conductive path, and wherein at least one of the first segment and the second segment is on an internal layer of the printed circuit board.

14. The communications connector of claim 12, wherein the communications connector is an RJ-45 jack, the plurality of input terminals comprise first through eighth input terminals, the plurality of output terminals comprise first through eighth output terminals, the plurality of signal current carrying conductive paths comprise first through eighth signal current carrying conductive paths, and the plurality of differential transmission lines comprise the first differential transmission line and second through fourth differential transmission lines.

15. The communications connector of claim 14, wherein at least one of the first and second signal current carrying conductive paths includes an inductive self-coupling section between the first and second sections.

16. A communications connector comprising:
a printed circuit board having a first internal conductive layer, first and second external conductive layers, and first and second dielectric layers, the first dielectric layer between the first external conductive layer and the first internal conductive layer and the second dielectric layer between the first internal conductive layer and the second external conductive layer, the first and second external conductive layers, the first internal conductive layer and the first and second dielectric layers stacked along a vertical axis,
wherein the printed circuit board includes first through eighth input terminals, first through eighth output terminals, and first through eighth signal current carrying conductive paths, each of which electrically connecting a respective one of the input terminals to a respective one of the output terminals, the first through eighth signal current carrying conductive paths arranged in pairs to form first through fourth differential transmission lines, with the first and second signal current carrying conductive paths forming the first differential transmission line,
wherein a return loss compensation circuit is formed in the first differential transmission line that includes a high impedance section in series with a tow-impedance section, where the impedances of the high and low impedance sections and the distance between the high and low impedance sections are selected to improve the return loss performance of the first differential transmission line at a maximum operating frequency of the communications connector, and
wherein the low impedance section comprises a first segment of the first signal carrying conductive path that is on a first layer of the printed circuit board that runs in generally the same direction as a second segment of the second signal current carrying conductive path that is on a second internal layer of the printed circuit board that is different than the first layer, the first and second segments positioned to have a capacitive reactance therebetween that exceeds their inductive reactance.

17. The communications connector of claim 16, wherein the impedances of the high and low impedance sub-sections and the distance between the high and low impedance sections are selected to create a peak in the return loss spectrum for the first differential transmission line that defines a local maximum in the return loss spectrum for the first differential transmission line, and
wherein the maximum operating frequency of the communications connector is within the peak in the return loss spectrum.

18. The communications connector of claim 16, wherein the first and second segments are routed in a vertically stacked arrangement.

19. The communications connector of claim 16, wherein the first segment of the first signal carrying conductive path has a first average width that exceeds the average width of the entirety of the first signal current carrying conductive path and/or the second segment of the second signal carrying conductive path has a second average width that exceeds the average width of the entirety of the second signal current carrying conductive path.

20. The communications connector of claim 16, wherein the low impedance section is between the high impedance section and the output terminals that are electrically connected to the first differential transmission line.

21. The communications connector of claim 20, wherein the high impedance section is formed by including a spiral in at least one of the first and second signal current carrying conductive paths to form an inductive self-coupling section in at least one of the first and second signal current carrying conductive paths.

* * * * *

UNITED STATES PATENT AND TRADEMARK OFFICE
CERTIFICATE OF CORRECTION

PATENT NO. : 9,318,848 B2  
APPLICATION NO. : 14/449383  
DATED : April 19, 2016  
INVENTOR(S) : Amid I. Hashim Page 1 of 1

It is certified that error appears in the above-identified patent and that said Letters Patent is hereby corrected as shown below:

In the Claims

Column 23, Claim 8, Line 15: Please correct "printed circuit hoard"
to read -- printed circuit board --

Column 24, Claim 16, Line 39: Please correct "with a tow-impedance"
to read -- with a low-impedance --

Signed and Sealed this
Twelfth Day of July, 2016

Michelle K. Lee
*Director of the United States Patent and Trademark Office*